United States Patent
Park

(10) Patent No.: US 7,999,290 B2
(45) Date of Patent: Aug. 16, 2011

(54) DUAL PANEL TYPE ORGANIC ELECTROLUMINESCENT DEVICE AND METHOD OF FABRICATING THE SAME

(75) Inventor: Jae-Yong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 202 days.

(21) Appl. No.: 12/314,805

(22) Filed: Dec. 17, 2008

(65) Prior Publication Data
US 2009/0128025 A1 May 21, 2009

Related U.S. Application Data

(62) Division of application No. 11/017,110, filed on Dec. 21, 2004, now Pat. No. 7,482,622.

(30) Foreign Application Priority Data

Dec. 26, 2003 (KR) .............................. 2003-0097983

(51) Int. Cl.
*H01L 21/336* (2006.01)

(52) U.S. Cl. ........ 257/213; 257/221; 257/225; 257/228; 257/231; 257/240; 257/290; 257/288; 257/E21.411

(58) Field of Classification Search ............... 257/40, 257/57, 59, 224, E29.151, 213, 221, 225, 257/228, 231, 240, 290, 288, 291, 292, 293, 257/414, 431, 444, 461, 462, 465, E21.411; 349/41, 42
See application file for complete search history.

(56) References Cited

U.S. PATENT DOCUMENTS

| 5,847,413 | A | 12/1998 | Yamazaki et al. |
| 6,175,345 | B1 | 1/2001 | Kuribayashi et al. |
| 6,239,468 | B1 * | 5/2001 | Chang et al. ............... 257/347 |
| 6,548,961 | B2 | 4/2003 | Barth et al. |
| 6,919,680 | B2 | 7/2005 | Shimoda et al. |
| 7,408,534 | B2 | 8/2008 | Koyama |
| 2002/0018278 | A1 | 2/2002 | Sato |
| 2002/0104995 | A1 | 8/2002 | Yamazaki et al. |
| 2002/0158577 | A1 | 10/2002 | Shinoda et al. |
| 2003/0095116 | A1 | 5/2003 | Koyama |
| 2003/0160247 | A1 | 8/2003 | Miyazawa |
| 2003/0201445 | A1 | 10/2003 | Park et al. |
| 2003/0205970 | A1 | 11/2003 | Park et al. |
| 2004/0036072 | A1 | 2/2004 | Tsujimura et al. |
| 2004/0069986 | A1 | 4/2004 | Park et al. |
| 2004/0129936 | A1 * | 7/2004 | Park et al. .................. 257/40 |
| 2005/0116236 | A1 | 6/2005 | Park et al. |

FOREIGN PATENT DOCUMENTS

| CN | 1454030 A | 4/2003 |
| JP | 2001-117509 | 4/2001 |
| KR | 10-0365519 | 6/2002 |
| KR | 2002-0047889 | 6/2002 |
| KR | 2004-0079476 | 9/2004 |
| WO | WO 02/078101 | 10/2002 |

* cited by examiner

*Primary Examiner* — Ha Tran T Nguyen
*Assistant Examiner* — Suberr Chi
(74) *Attorney, Agent, or Firm* — Morgan, Lewis & Bockius LLP

(57) ABSTRACT

An organic electroluminescent device includes first and second substrates facing each other and spaced apart from each other; a gate line on an inner surface of the first substrate; a data line and a power line crossing the gate line and spaced apart from each other; a switching thin film transistor connected to the gate line and the data line; a driving thin film transistor connected to the switching thin film transistor and the power line, the driving thin film transistor including a channel region having a ring shape; an electric connection pattern connected to the driving thin film transistor, the connection pattern being disposed over the driving thin film transistor; and an organic electroluminescent diode on an inner surface of the second substrate, the organic electroluminescent diode being connected to the electric connection pattern.

10 Claims, 22 Drawing Sheets

Emission direction

Emission direction

DUAL PANEL TYPE ORGANIC ELECTROLUMINESCENT DEVICE AND METHOD OF FABRICATING THE SAME

This application is a divisional of U.S. patent application Ser. No. 11/017,110, filed in the United States on Dec. 21, 2004, now U.S. Pat. No. 7,482,622 and claims the benefit of Korean Patent Application No. 2003-0097983 filed in Korea on Dec. 26, 2003, both of which are hereby incorporated by reference.

BACKGROUND OF THE INVENTION

1. Field of the Invention

The present invention relates to an organic electroluminescent device, and more particularly, to a dual panel type organic electroluminescent device and a method of fabricating the same.

2. Discussion of the Related Art

Among flat panel displays (FPDs), organic electroluminescent (EL) devices have been of particular interest in research and development because they are light-emitting type displays having a wide viewing angle as well as a high contrast ratio in comparison to liquid crystal display (LCD) devices. Organic EL devices are lightweight and small, as compared to other types of display devices, because they do not need a backlight. Organic EL devices have other desirable characteristics, such as low power consumption, superior brightness and fast response time. When driving the organic EL devices, only a low direct current (DC) voltage is required. Moreover, a fast response time can be obtained. Unlike LCD devices, organic EL devices are entirely formed in a solid phase arrangement. Thus, organic EL devices are sufficiently strong to withstand external impacts and also have a greater operational temperature range. Moreover, organic EL devices are fabricated in a relatively simple process involving few processing steps. Thus, it is much cheaper to produce an organic EL device in comparison to an LCD device or a plasma display panel (PDP). In particular, only deposition and encapsulation processes are necessary for manufacturing organic EL devices.

FIG. 1 is a cross-sectional view of a related art organic electroluminescent device. Referring to FIG. 1, first and second substrates 10 and 60, which have inner surfaces facing each other and are spaced apart from each other, have a plurality of pixel regions "P." An array layer "AL" is formed on an inner surface of the first substrate 10. The array layer "AL" includes a driving thin film transistor (TFT) "Td" in each pixel region "P." A first electrode 48 connected to the driving TFT "Td" is formed on the array layer "AL" in each pixel region "P." Red, green and blue organic electroluminescent (EL) layers 54 are alternately formed on the first electrode 48. A second electrode 56 is formed on the organic EL layer 54. The first and second electrodes 48 and 56, and the organic EL layer 54 interposed therebetween constitute an organic EL diode "$D_{EL}$." The organic EL device is a bottom type device where light is emitted from the organic EL layer 54 through the first electrode 48 and out of the first substrate 10.

The second substrate 60 is used as an encapsulation substrate. The second substrate 60 has a concave portion 62 at its inner center. The concave portion 62 is filled with a moisture absorbent desiccant 64 that removes moisture and oxygen to protect the organic EL diode "$D_{EL}$." The inner surface of the second substrate 60 is spaced apart from the second electrode 56. The first and second substrates 10 and 60 are attached with a sealant 70 at a peripheral portion of the first and second substrates 10 and 60.

FIG. 2A is a plan view of an organic electroluminescent device according to the related art. Referring to FIG. 2A, a gate line 22 crosses a data line 42 and a power line 28. The data line 42 and the power line 28 are spaced apart from each other. A pixel region "P" is defined by the gate line 22, the data line 42 and the power line 28. A switching thin film transistor (TFT) "Ts" is disposed adjacent to the crossing of the gate line 22 and the data line 42. A driving TFT "Td" is connected to the switching TFT "Ts" and the power line 28. A storage capacitor "Cst" uses a power electrode 26 extending from the power line 28 as a first capacitor electrode and an active pattern 16 extending from a switching semiconductor layer 31 of the switching TFT "Ts" as a second capacitor electrode.

FIG. 2B is a cross-sectional view taken along line "IIb-IIb" of FIG. 2A. In FIG. 2B, a buffer layer 12 is formed on a first substrate 10. A driving semiconductor layer 14 and an active pattern 16 separated from each other are formed on the buffer layer 12. A gate insulating layer 18 and a gate electrode 20 are sequentially formed on the driving semiconductor layer 14. The driving semiconductor layer 14 includes an active region "IIc" corresponding to the gate electrode 20, and drain and source regions "IId" and "IIe" at both sides of the active region "IIc."

A first passivation layer 24 is formed on the gate electrode 20 and the active pattern 16. A power electrode 26 corresponding to the active pattern 16 is formed on the first passivation layer 24.

A second passivation layer 30 is formed on the power electrode 26. The first and second passivation layers 24 and 30 have first and second contact holes exposing portions of the drain and source regions "IId" and "IIe," respectively. Moreover, the second passivation layer 30 has a third contact hole 36 exposing a portion of the power electrode 26.

Drain and source electrodes 40 and 38 are formed on the second passivation layer 30. The drain electrode 40 is connected to the drain region "IId" of the driving semiconductor layer 14 through the first contact hole 32. The source electrode 38 is connected to the source region "IIe" of the driving semiconductor layer 14 through the second contact hole 34 and connected to the power electrode 26 through the third contact hole 36.

A third passivation layer 44 is formed on the drain and source electrodes 40 and 38. The third passivation layer 44 has a drain contact hole 46 exposing a portion of the drain electrode 40. The driving semiconductor layer 14, the gate electrode 20, the drain electrode 40 and the source electrode 38 constitute the driving thin film transistor (TFT) "Td."

A first electrode 48 connected to the drain electrode 40 through the drain contact hole 46 is formed on the third passivation layer 44. An insulating interlayer 50 having an open portion exposing the first electrode 48 is formed on the first electrode 48. An organic electroluminescent (EL) layer 54 is formed on the insulating interlayer 50. A second electrode 56 is formed on the organic EL layer 54. The organic EL layer 54 contacts the first electrode 48 through the open portion of the insulating interlayer 50. The first and second electrodes 48 and 56 and the organic EL layer 54 interposed therebetween constitute an organic EL diode "$D_{EL}$."

In an organic EL device according to the related art, an array layer and an organic EL diode are formed on a first substrate, and an additional second substrate is attached with the first substrate for encapsulation. However, when the array layer and the organic EL diode are formed on one substrate in such a manner, production yield of the organic EL device is determined by multiplying the TFT's yield with the organic EL diode's yield. Since the organic EL diode's yield is relatively low, the production yield of the overall EL device is limited by the organic EL diode's yield. For example, even when a TFT is well fabricated, an organic EL device using a thin film of about 1000 Å thickness can be judged as bad due to defects in an organic EL layer. This results in loss of material and increased production cost.

In general, organic EL devices are classified into bottom emission types and top emission types according to an emission direction of light used for displaying images through the organic EL devices. Bottom emission type organic EL devices have the advantages of high encapsulation stability and high process flexibility. However, the bottom emission type organic EL devices are ineffective for high resolution devices because they have poor aperture ratios. In contrast, top emission type organic EL devices have a higher expected life span because they are more easily designed and they have a high aperture ratio. However, in top emission type organic EL devices, the cathode is generally formed on an organic EL layer. As a result, transmittance and optical efficiency of top emission type organic EL devices are reduced because a limited number of materials may be selected. If a thin film-type passivation layer is formed to prevent a reduction of the light transmittance, the thin film-type passivation layer may fail to prevent infiltration of exterior air into the device.

SUMMARY OF THE INVENTION

Accordingly, the present invention is directed to an organic electroluminescent device and a method of fabricating the same that substantially obviate one or more of the problems due to limitations and disadvantages of the related art.

An object of the present invention is to provide an organic electroluminescent device having an improved production yield.

Another object of the present invention is to provide an organic electroluminescent device having a high resolution.

Another object of the present invention is to provide an organic electroluminescent device having a high aperture ratio.

Another object of the present invention is to provide a method of fabricating an organic electroluminescent device having an improved production yield.

Another object of the present invention is to provide a method of fabricating an organic electroluminescent device having a high resolution.

Another object of the present invention is to provide a method of fabricating an organic electroluminescent device having a high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates facing each other and spaced apart from each other; a gate line on an inner surface of the first substrate; a data line and a power line crossing the gate line and spaced apart from each other; a switching thin film transistor connected to the gate line and the data line; a driving thin film transistor connected to the switching thin film transistor and the power line, the driving thin film transistor including a channel region having a ring shape; an electric connection pattern connected to the driving thin film transistor, the connection pattern being disposed over the driving thin film transistor; and an organic electroluminescent diode on an inner surface of the second substrate, the organic electroluminescent diode being connected to the electric connection pattern.

In another aspect, an organic electroluminescent device includes first and second substrates facing each other and spaced apart from each other; a gate line on an inner surface of the first substrate; a data line and a power line crossing the gate line and spaced apart from each other; a switching thin film transistor connected to the gate line and the data line; a driving thin film transistor connected to the switching thin film transistor and the power line, the driving thin film transistor having a channel region including at least two-half ring shapes; an electric connection pattern connected to the driving thin film transistor, the connection pattern being disposed over the driving thin film transistor; and an organic electroluminescent diode on an inner surface of the second substrate, the organic electroluminescent diode being connected to the electric connection pattern.

In another aspect, a method of fabricating an organic electroluminescent device includes forming a gate line on a first substrate; forming a data line crossing the gate line; forming a power line spaced apart from the data line; forming a switching thin film transistor connected to the gate line and the data line; forming a driving thin film transistor connected to the switching thin film transistor and the power line, the driving thin film transistor having a channel region having a ring shape; forming an organic electroluminescent diode on a second substrate; forming an electric connection pattern over one of the driving thin film transistor and the organic electroluminescent diode; and attaching the first and second substrates such that the electric connection pattern electrically connects the driving thin film transistor and the organic electroluminescent diode.

In another aspect, a method of fabricating an organic electroluminescent device includes forming a gate line on a first substrate; forming a data line crossing the gate line; forming a power line spaced apart from the data line; forming a switching thin film transistor connected to the gate line and the data line; forming a driving thin film transistor connected to the switching thin film transistor and the power line, the driving thin film transistor having a channel region including at least two-half ring shapes; forming an organic electroluminescent diode on a second substrate; forming an electric connection pattern over one of the driving thin film transistor and the organic electroluminescent diode; and attaching the first and second substrates such that the electric connection pattern electrically connects the driving thin film transistor and the organic electroluminescent diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the preferred embodiments of the present invention, examples of which are illustrated in the accompanying drawings.

Figure 1:
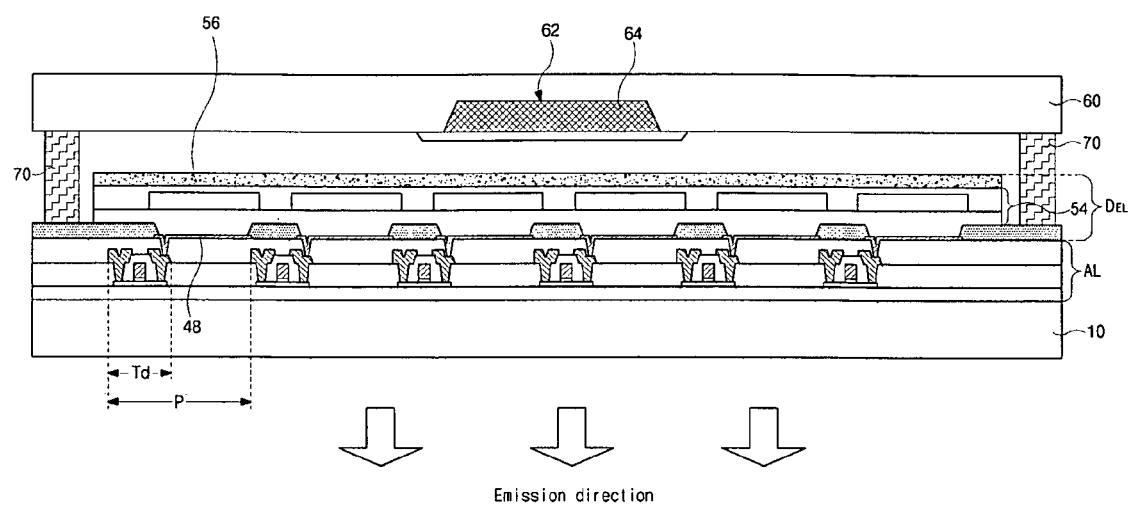
FIG. 1 is a cross-sectional view of a related art organic electroluminescent device.
Figure 2A:
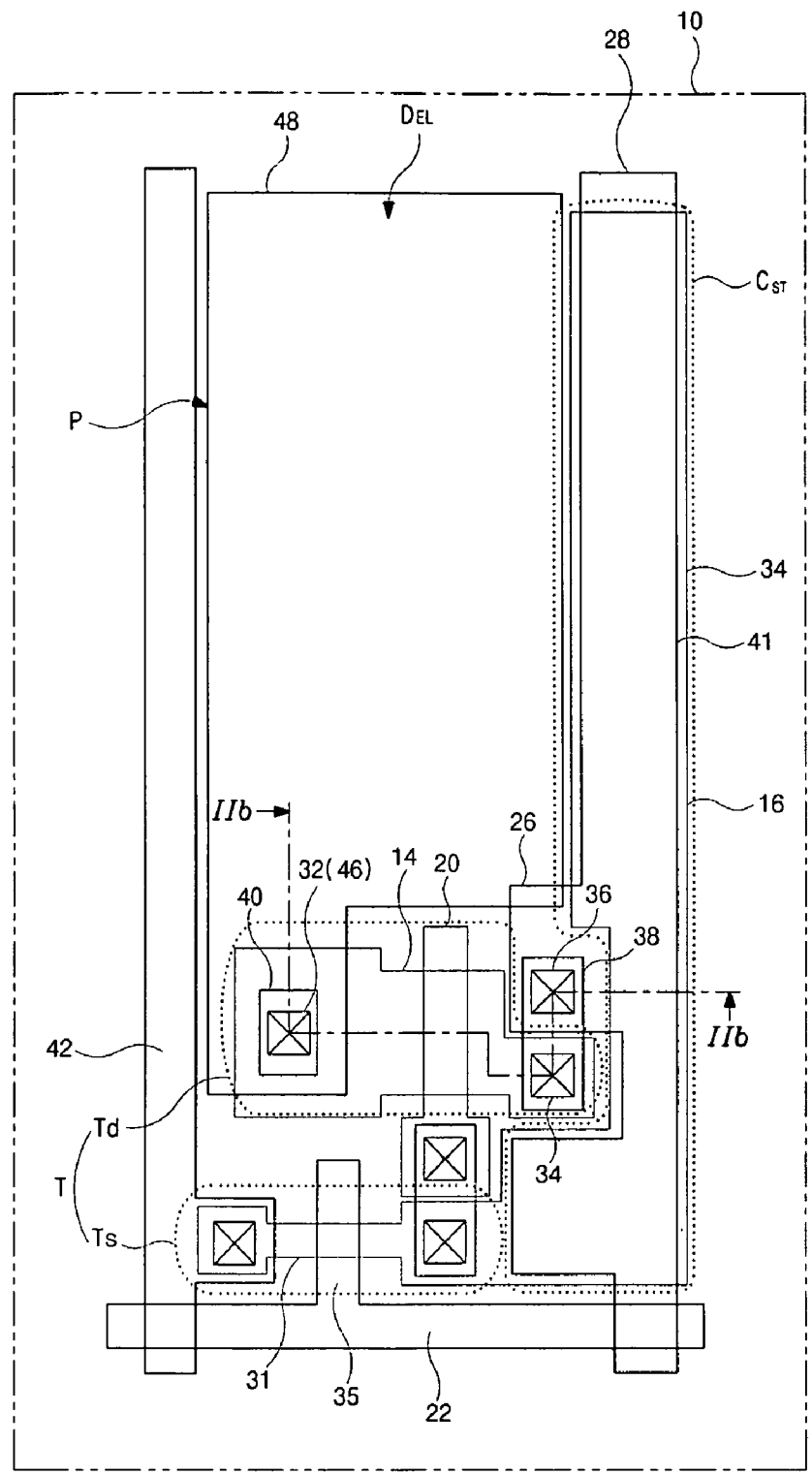
FIG. 2A is a plan view of an organic electroluminescent device according to the related art.
Figure 2B:
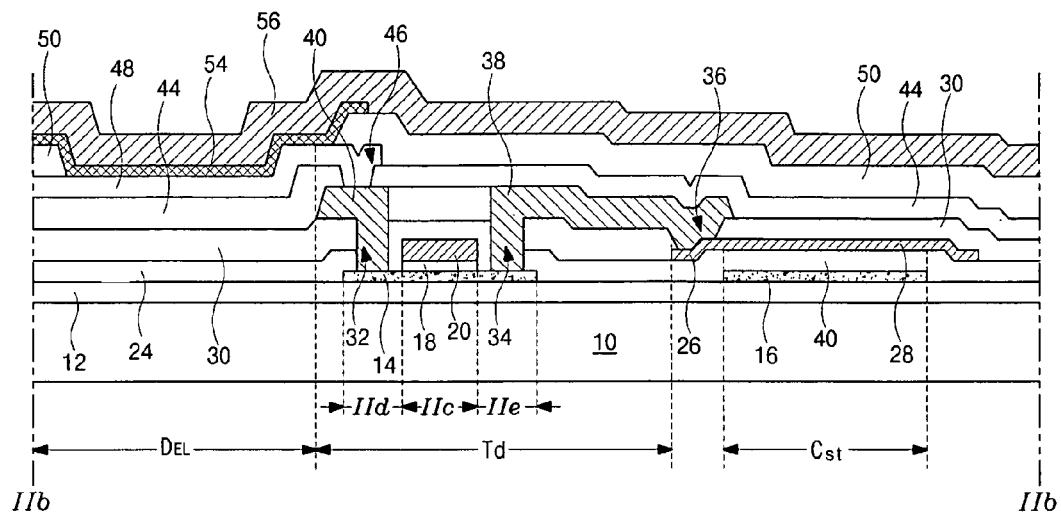
FIG. 2B is a cross-sectional view taken along line "IIb-IIb" of FIG. 2A.
Figure 3:
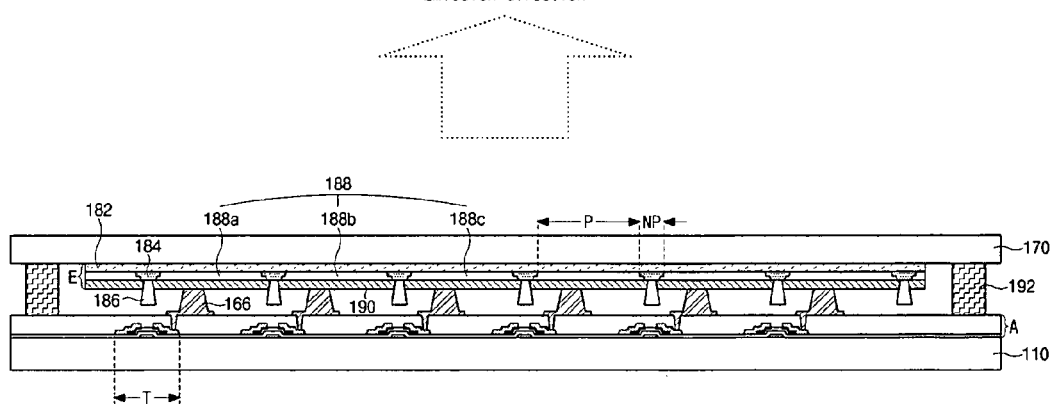
FIG. 3 is a cross-sectional view of an exemplary dual panel type organic electroluminescent device according to an embodiment of the present invention.

FIG. 3 is a cross-sectional view of an exemplary dual panel type organic electroluminescent device according to an embodiment of the present invention. Referring to FIG. 3, a first substrate 110 and a second substrate 170, which have inner surfaces facing each other and are spaced apart from each other, include a plurality of pixel regions "P." An array layer "A" including a thin film transistor (TFT) "T" is formed on an inner surface of the first substrate 110. A connection pattern 166 connected to the TFT "T" is formed on the array layer "A." The connection pattern 166 has a thickness such that the array layer "A" on the first substrate 110 is connected to an organic electroluminescent (EL) diode "E" on the second substrate 170 through the connection pattern 166. For example, the connection pattern 166 may have a thickness corresponding to a distance, which is a cell gap between the first and second substrates 110 and 170. Moreover, the TFT "T" may be a driving TFT, which applies a current to the organic EL diode. The TFT "T" may further have an inverted staggered structure using amorphous silicon.

A first electrode 182 is formed on an entire inner surface of the second substrate 170. An interlayer insulating layer 184 and a plurality of separators 186 are sequentially formed on the first electrode 182 in a non-pixel region "NP" between the adjacent pixel regions "P." The separators 186 may each have a tapered shape. An organic luminescent layer 188 and a second electrode 190 are sequentially formed on the first electrode 182 between adjacent separators 186. Each of the separators 186 may have a thickness and a shape such that the organic luminescent layer 188 and the second electrode 190 are automatically separated in each pixel region "P" by the separators 186. The organic luminescent layer 188 may include red, green and blue luminescent layers 188a, 188b and 188c alternately disposed in each pixel region "P."

The first electrode 182, the second electrode 190 and the organic luminescent layer 188 between the first electrode 182 and the second electrode 190 form an organic electroluminescent (EL) diode "E." The first electrode 182 may include a transparent material such that light from the organic luminescent layer 188 is emitted through the first electrode 182, i.e., a top emission type. In one embodiment of the present invention, the first electrode 182 is an anode and the second electrode 190 is a cathode. In this case, the first electrode 182 may include a transparent conductive material such as indium-tin-oxide (ITO) and indium-zinc-oxide (IZO). In addition, the first substrate 110 and the second substrate 170 may be attached by a seal pattern 192 in a boundary portion of the first substrate 110 and the second substrate 170.

The exemplary dual panel type organic EL device depicted in FIG. 3 has an improved production yield and longer lifetime because the array layer "A" including the TFT "T" and the organic EL diode "E" are formed on their own respective substrates. In addition, TFT design is easier because the dual panel type organic EL diode is a top emission type. Moreover, the exemplary dual panel type organic EL device depicted in FIG. 3 provides high resolution and high aperture ratio. Moreover, the fabrication process is simplified because the organic luminescent layer 188 and the second electrode 190 are automatically patterned by the plurality of separators 186 without using an additional shadow mask.

Although not shown in FIG. 3, the dual panel type organic EL device may further include a full-color displaying element, such as a single layer of color filter and a double layer of color filter and color-changing medium for displaying full-color. When the full-color displaying element is formed in the dual panel type organic EL device, the organic luminescent layer 188 may include a luminescent material emitting a single color.

Figure 4A:
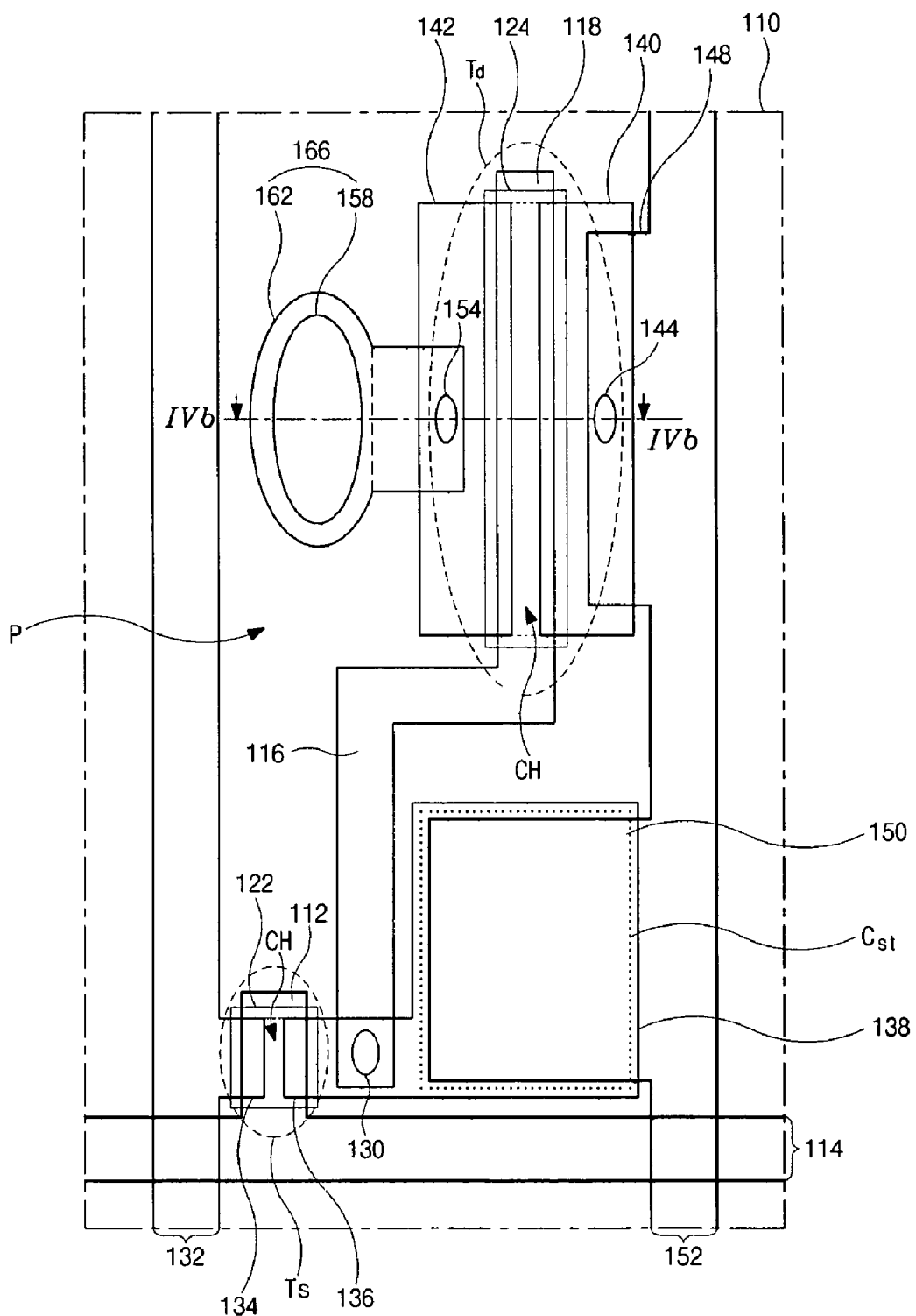
FIG. 4A is a plan view of a single pixel region of a substrate for an exemplary dual panel type organic electroluminescent device according to an embodiment of the present invention.
Figure 4B:
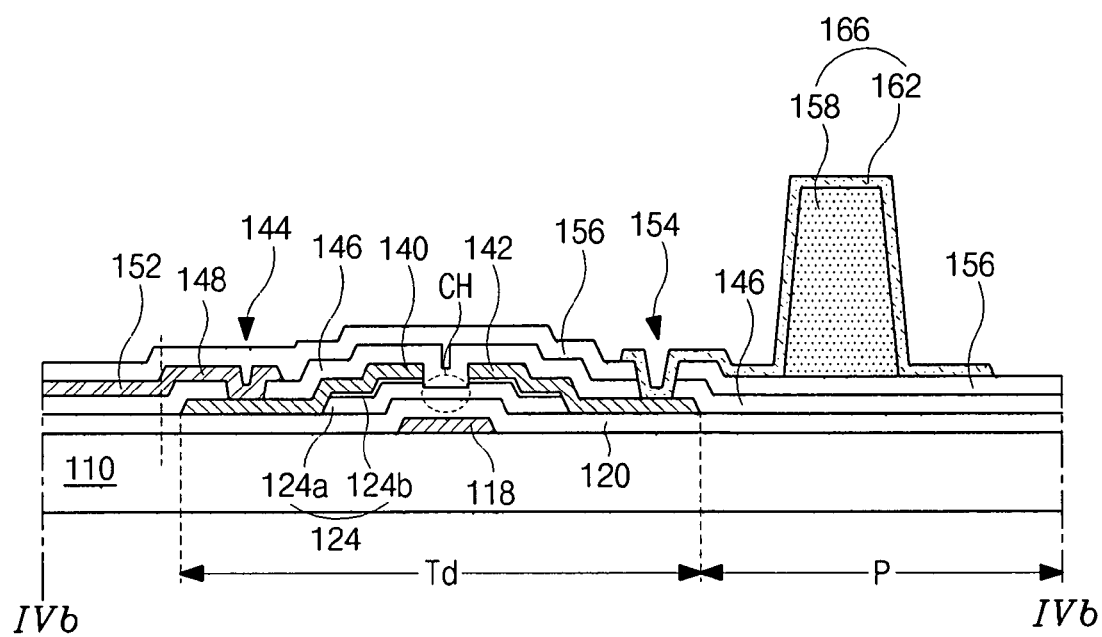
FIG. 4B is a cross-sectional view taken along line "IVb-IVb" of FIG. 4A.

FIG. 4A is a plan view of a single pixel region of a substrate for an exemplary dual panel type organic electroluminescent device according to an embodiment of the present invention. FIG. 4B is a cross-sectional view taken along line "IVb-IVb" of FIG. 4A. Referring to FIGS. 4A and 4B, a gate line 114 (shown in FIG. 4A) having a switching gate electrode 112 is formed on a first substrate 110 along a first direction. A driving gate electrode 118 having an island shape is formed on the first substrate 110 along a second direction perpendicular to the first direction. A connection line 116 (shown in FIG. 4A) extends from the driving gate electrode 118 to an adjacent portion of the switching gate electrode 112. A gate insulating layer 120 is formed on the switching gate electrode 112, the gate line 114, the connection line 116 and the driving gate electrode 118. A first contact hole 130 is provided through the gate insulating layer 120. The first contact hole exposes a portion of the connection line 116.

A switching semiconductor layer 122 and a driving semiconductor layer 124 are formed on the gate insulating layer 120 to correspond to the switching gate electrode 112 and the driving gate electrode 118, respectively. The driving semiconductor layer 124 has an island shape. The driving semiconductor layer 124 also includes an active layer 124a and an ohmic contact layer 124b. The active layer 124a may include an intrinsic amorphous silicon. The ohmic contact layer 124b may include an impurity-doped amorphous silicon. Although not shown in FIG. 4B, the switching semiconductor layer 122 may have the same cross-sectional structure as the driving semiconductor layer 124. The switching semiconductor layer 122 and the driving semiconductor layer 124 may each include one of an amorphous silicon and a microcrystalline silicon.

A switching source electrode 134 and a switching drain electrode 136 spaced apart from each other are formed on the switching semiconductor layer 122. In addition, a driving source electrode 140 and a driving drain electrode 142 having an island shape and spaced apart from each other are formed on the driving semiconductor layer 124. A data line 132 is connected to the switching source electrode 134. The data line 132 is disposed along the second direction. The switching drain electrode 136 is connected to the connection line 116 through the first contact hole 130. A first capacitor electrode 138 extends from the switching drain electrode 136.

The switching gate electrode 112, the switching semiconductor layer 122, the switching source electrode 134 and the switching drain electrode 136 form a switching thin film transistor (TFT) "Ts." The driving gate electrode 118, the driving semiconductor layer 124, the driving source electrode 140 and the driving drain electrode 142 form a driving thin film transistor (TFT) "Td." The switching semiconductor layer 122 between the switching source electrode 134 and the switching drain electrode 136 forms a channel region for carrier transmissions. Similarly, the driving semiconductor layer 124 between the driving source electrode 140 and the driving drain electrode 142 is also a channel region.

A first passivation layer 146 is formed on the switching TFT "Ts" and the driving TFT "Td." A second contact hole 144 is provided through the first passivation layer 146. The second contact hole 144 exposes a portion of the driving source electrode 140.

A power electrode 148, a second capacitor electrode 150 and a power line 152 are formed on the first passivation layer 146. The power electrode 148 and the second capacitor electrode 150 extend from the power line 152, which is spaced apart and parallel to the data line 132. In addition, the power electrode 148 is connected to the driving source electrode 140 through the second contact hole 144, and the second capacitor electrode 150 corresponds to the first capacitor electrode 138 to constitute a storage capacitor "Cst" with the first passivation layer 146 interposed therebetween. The gate line 114, the data line 132 and the power line 152 define a pixel region "P."

A second passivation layer 156 having a third contact hole 154 through the first passivation layer 146 is formed on the power electrode 148, the second capacitor electrode 150 and the power line 152. The third contact hole 154 exposes a portion of the driving drain electrode 142. A protrusive pattern 158 is formed on the second passivation layer 156 in the pixel region "P" adjacent to the third contact hole 154. A connection electrode 162 connected to the driving drain electrode 142 through the third contact hole 154 is formed on the protrusive pattern 158. The protrusive pattern 158 and the connection electrode 162 thereon form an electric connection pattern 166.

In the dual panel type organic EL device according to an embodiment of the present invention, the TFT may have a bottom gate structure based on production cost and efficiency. Accordingly, amorphous silicon or microcrystalline silicon may be used for the active layer. The microcrystalline silicon includes fine grains generated by injecting a high quantity of hydrogen. Since a TFT using amorphous silicon has a mobility of less than about 1 cm$^2$/V·sec, the TFT is required to have a high width-to-length (W/L) ratio to generate a sufficient driving current for an organic EL device.

In a dual panel type organic EL device, the area for the electric connection pattern 166 contacting the first and second substrates decreases in accordance with an increase in the W/L ratio of the driving TFT Td. Moreover, when the connection electrode 162 does not completely wrap the protrusive pattern 158 and a periphery thereof, the connection electrode 162 may be torn or lifted from the protrusive pattern 158. Accordingly, a sufficient area is required for completely wrapping the protrusive pattern.

Figure 5A:
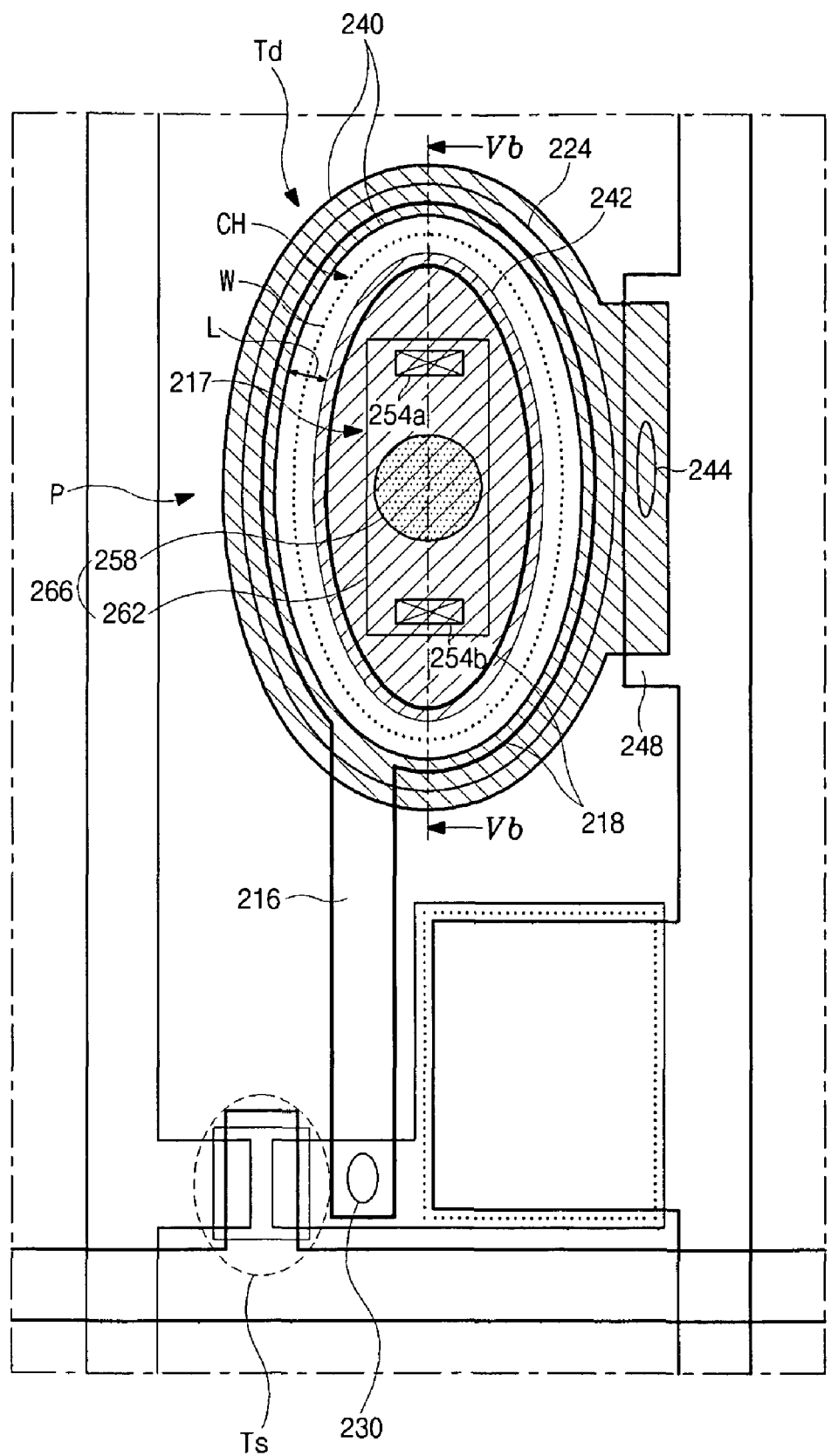
FIG. 5A is a plan view showing a pixel region of a substrate for an exemplary dual panel type organic electroluminescent device according to another embodiment of the present invention.
Figure 5B:
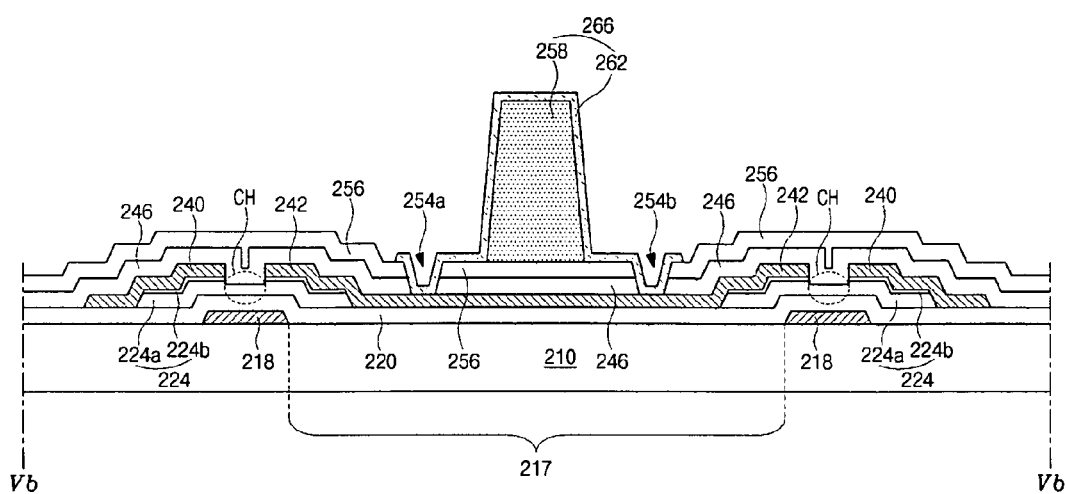
FIG. 5B is a cross-sectional view taken along line "Vb-Vb" of FIG. 5A.

FIG. 5A is a plan view showing a pixel region of a substrate for an exemplary dual panel type organic electroluminescent device according to another embodiment of the present invention. FIG. 5B is a cross-sectional view taken along line "Vb-Vb" of FIG. 5A. Referring to FIGS. 5A and 5B, a driving gate electrode 218 having a ring shape extends from a connection line 216 connected to a switching drain electrode 236 of a switching thin film transistor (TFT) "Ts." The driving gate electrode 218 includes an open portion 217. In an embodiment of the present invention, the open portion 217 has a circular shape. In other embodiments of the present invention, the open portion 217 may have an elliptical shape.

A gate insulating layer 220 is formed on the driving gate electrode 218 and the connection line 216. A driving semiconductor layer 224 is formed on the gate insulating layer 220 corresponding to the driving gate electrode 218. A first contact hole 230 is provided through the gate insulating layer 220. The first contact hole 230 exposes a portion of the connection line 216. The driving semiconductor layer 224 includes one of an amorphous silicon and a microcrystalline silicon. In addition, the driving semiconductor layer 224 may include a driving active layer 224a and a driving ohmic contact layer 224b. The driving active layer 224a may include an intrinsic semiconductor material and the driving ohmic contact layer 224b may include an impurity-doped semiconductor material.

A driving source electrode 240 and a driving drain electrode 242 are spaced apart from each other and are formed on the driving semiconductor layer 224. The driving source electrode 240 and the driving drain electrode 242 overlap an outer edge portion of the driving gate electrode 218 and an inner edge portion of the driving gate electrode 218, respectively. Accordingly, the driving source electrode 240 is disposed to surround the driving gate electrode 218, and the driving drain electrode 242 is disposed in the open portion 217 of the driving gate electrode 218. A portion of the driving active layer 224a is exposed through a space between the driving source electrode 240 and the driving drain electrode 242 to form a driving channel region "CH." In addition, the driving gate electrode 218, the driving semiconductor layer 224, the driving source electrode 240 and the driving drain electrode 242 form a driving thin film transistor (TFT) "Td."

A first passivation layer 246 is formed on the driving TFT "Td." A power electrode 248 is formed on the first passivation layer 246. A second contact hole 244 is provided through the first passivation layer 246. The second contact hole 244 exposes a portion of the driving source electrode 240. The power electrode 248 is connected to the driving source electrode 240 through the second contact hole 244.

A second passivation layer 256 having third and fourth contact holes 254a and 254b through the first passivation layer 246 is formed on the power electrode 248. The third and fourth contact holes expose portions of the driving drain electrode 242. A protrusive pattern 258 is formed on the second passivation layer 256 over the driving drain electrode 242. A connection electrode 262 is formed on the protrusive pattern 258. The connection electrode 262 is connected to the driving drain electrode 242 through the third and fourth contact holes 254a and 254b. The protrusive pattern 258 and the connection electrode 262 thereon form an electric connection pattern 266. Furthermore, the connection electrode 262 may completely wrap the protrusive pattern 258.

In an embodiment of the present invention, a width "W" of the driving channel region "CH" having a ring shape corresponds to a circumference of a central circle of the driving channel region "CH." Accordingly, a current may flow along a radial direction of the ring shape between the driving source electrode 240 and the driving drain electrode 242. As a result, the width "W" and a W/L ratio of the driving channel region "CH" are sufficiently high in values for carrying a high driving current. Moreover, since the electric connection pattern 266 is formed over the driving drain electrode 242, a sufficient area is obtained for the electric connection pattern 266. Furthermore, a potential deterioration of the attachment due to a separator (not shown) is reduced because the connection pattern 266 is disposed in a central portion of the pixel region "P."

Figure 6A:
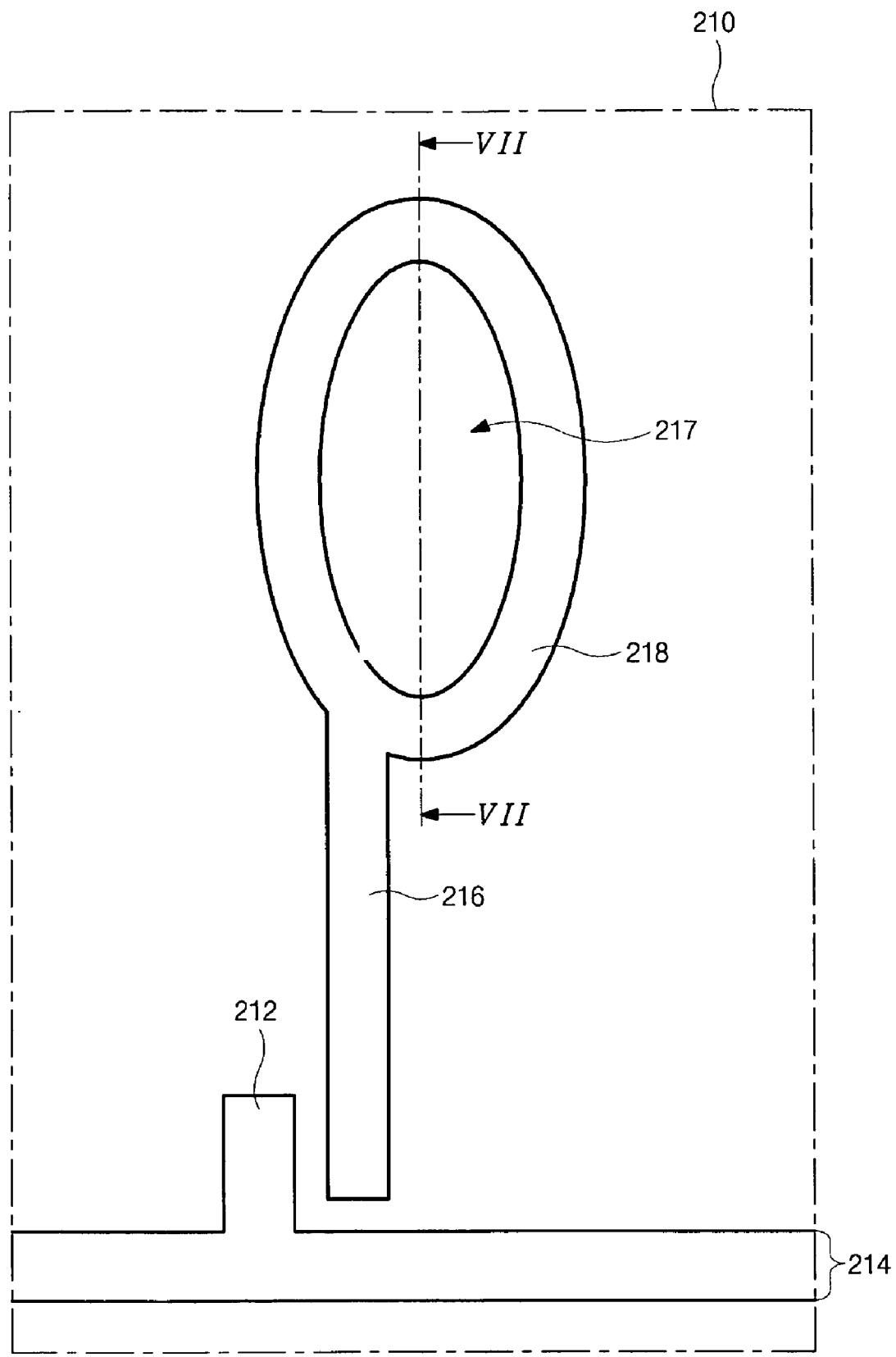
FIG. 6A is a plan view of the formation of a connection line and a gate electrode in a process of fabricating a substrate for a dual panel type organic electroluminescent device according to another embodiment of the present invention.
Figure 7A:
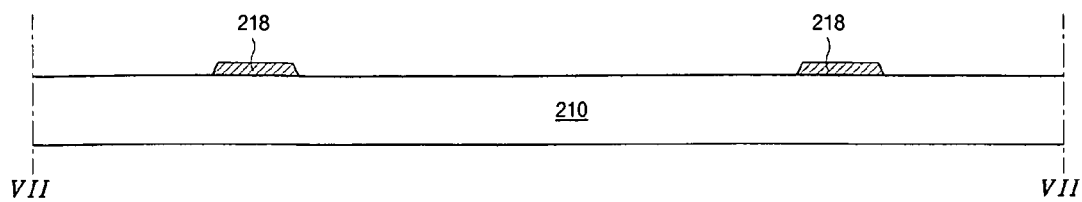
FIG. 7A is a cross-sectional view taken along line "VII-VII" of FIG. 6A.

FIG. 6A is a plan view of the formation of a connection line and a gate electrode in a process of fabricating a substrate for a dual panel type organic electroluminescent device according to another embodiment of the present invention. FIG. 7A is a cross-sectional view taken along line "VII-VII" of FIG. 6A. Referring to FIGS. 6A and 7A, a gate line 214 is formed on a first substrate 210 along a first direction. The gate line 214 includes a switching gate electrode 212. At the same time, a connection line 216 and a driving gate electrode 218 having a ring shape are formed on the first substrate 210. The connection line 216 is disposed along a second direction perpendicular to the first direction. The driving gate electrode 218 has an open portion 217 at a center portion thereof. In an embodiment of the present invention, the open portion 217 has a circular shape. In other embodiments of the present invention, the open portion 217 may have an elliptical shape.

Figure 6B:
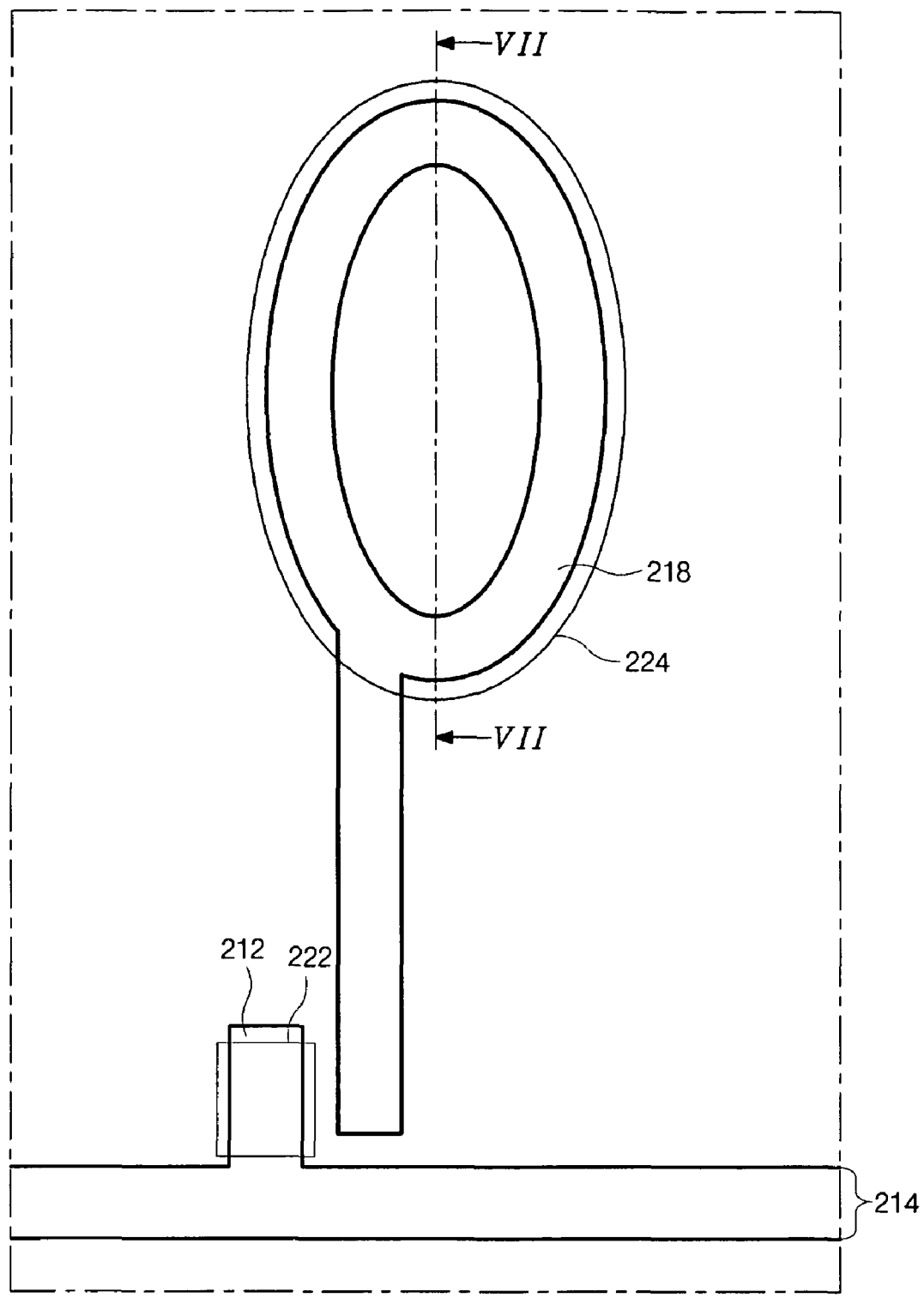
FIG. 6B is a plan view of the formation of a switching semiconductor layer and a driving semiconductor layer in a process of fabricating a substrate for a dual panel type organic electroluminescent device according to another embodiment of the present invention.
Figure 7B:
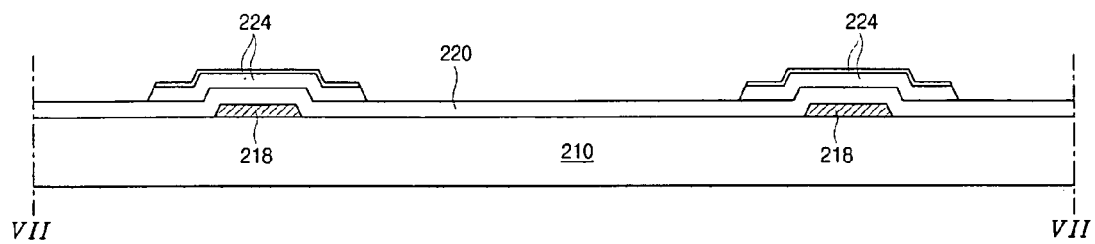
FIG. 7B is a cross-sectional view taken along line "VII-VII" of FIG. 6B.

FIG. 6B is a plan view of the formation of a switching semiconductor layer and a driving semiconductor layer in a process of fabricating a substrate for a dual panel type organic electroluminescent device according to another embodiment of the present invention. FIG. 7B is a cross-sectional view taken along line "VII-VII" of FIG. 6B. Referring to FIGS. 6B and 7B, a gate insulating layer 220 is formed on the substrate 210 including the gate line 214. An intrinsic semiconductor material and an impurity-doped semiconductor material are sequentially deposited on the gate insulating layer 220. Then, a switching semiconductor layer 222 and a driving semiconductor layer 224 are formed on the gate insulating layer 220. The switching semiconductor layer 222 and the driving semiconductor layer 224 correspond to the switching gate electrode 212 and the driving gate electrode 218, respectively. For example, the switching semiconductor layer 222 and the driving semiconductor layer 224 may include one of an amorphous silicon and a microcrystalline silicon.

Figure 6C:
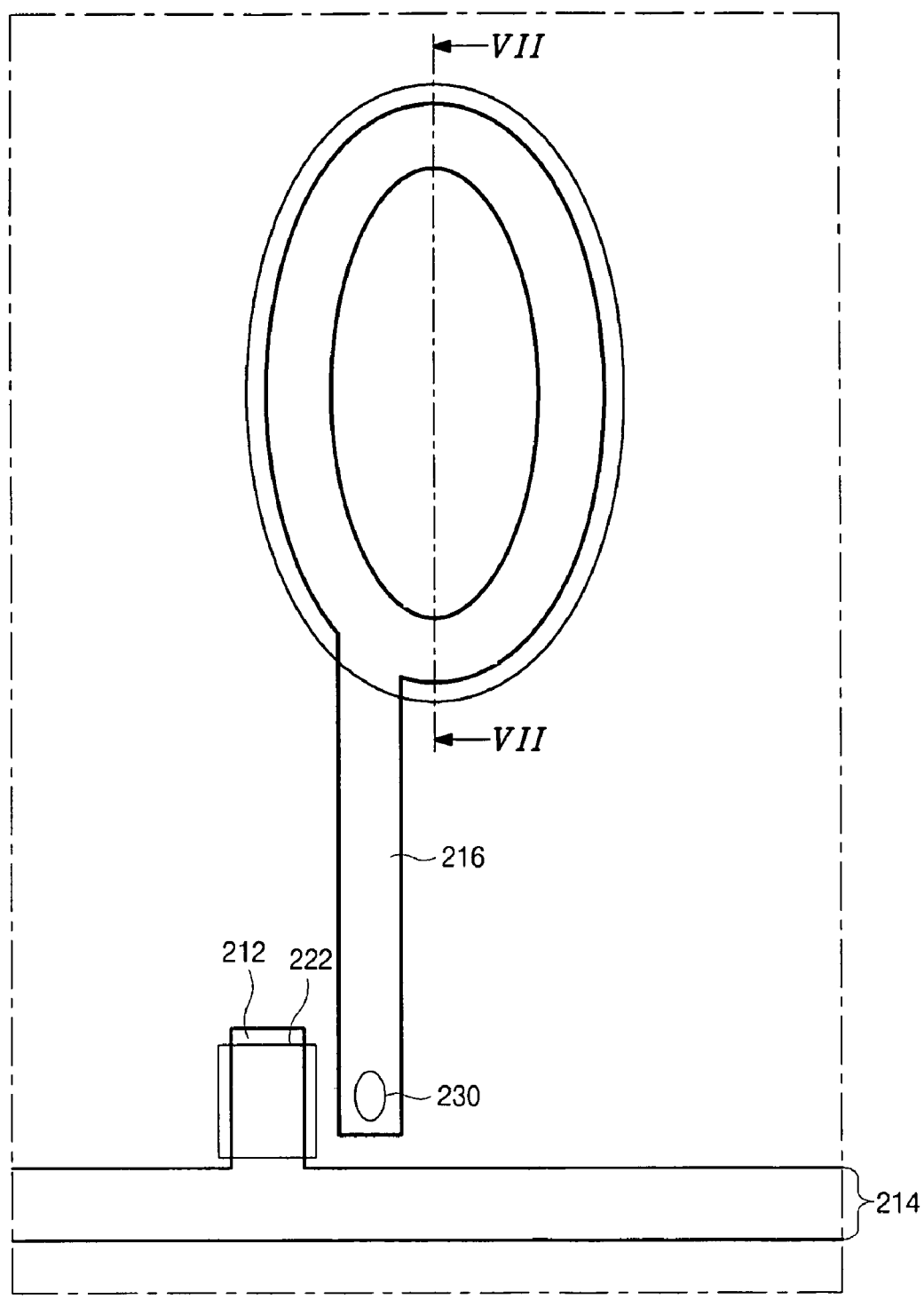
FIG. 6C is a plan view of the formation of a contact hole in a process of fabricating a substrate for a dual panel type organic electroluminescent device according to another embodiment of the present invention.
Figure 7C:
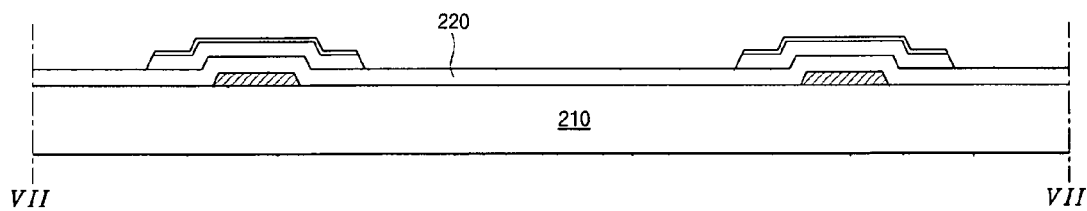
FIG. 7C is a cross-sectional view taken along line "VII-VII" of FIG. 6C.

FIG. 6C is a plan view of the formation of a contact hole in a process of fabricating a substrate for a dual panel type organic electroluminescent device according to another embodiment of the present invention. FIG. 7C is a cross-sectional view taken along line "VII-VII" of FIG. 6C. Referring to FIGS. 6C and 7C, a first contact hole 230 is formed in the gate insulating layer 220. The first contact hole 230 exposes a portion of the connection line 216 through the gate insulating layer 220. As shown in FIG. 6C, the first contact hole 230 may be positioned near a crossing of the switching gate electrode 212 and the gate line 214.

Figure 6D:
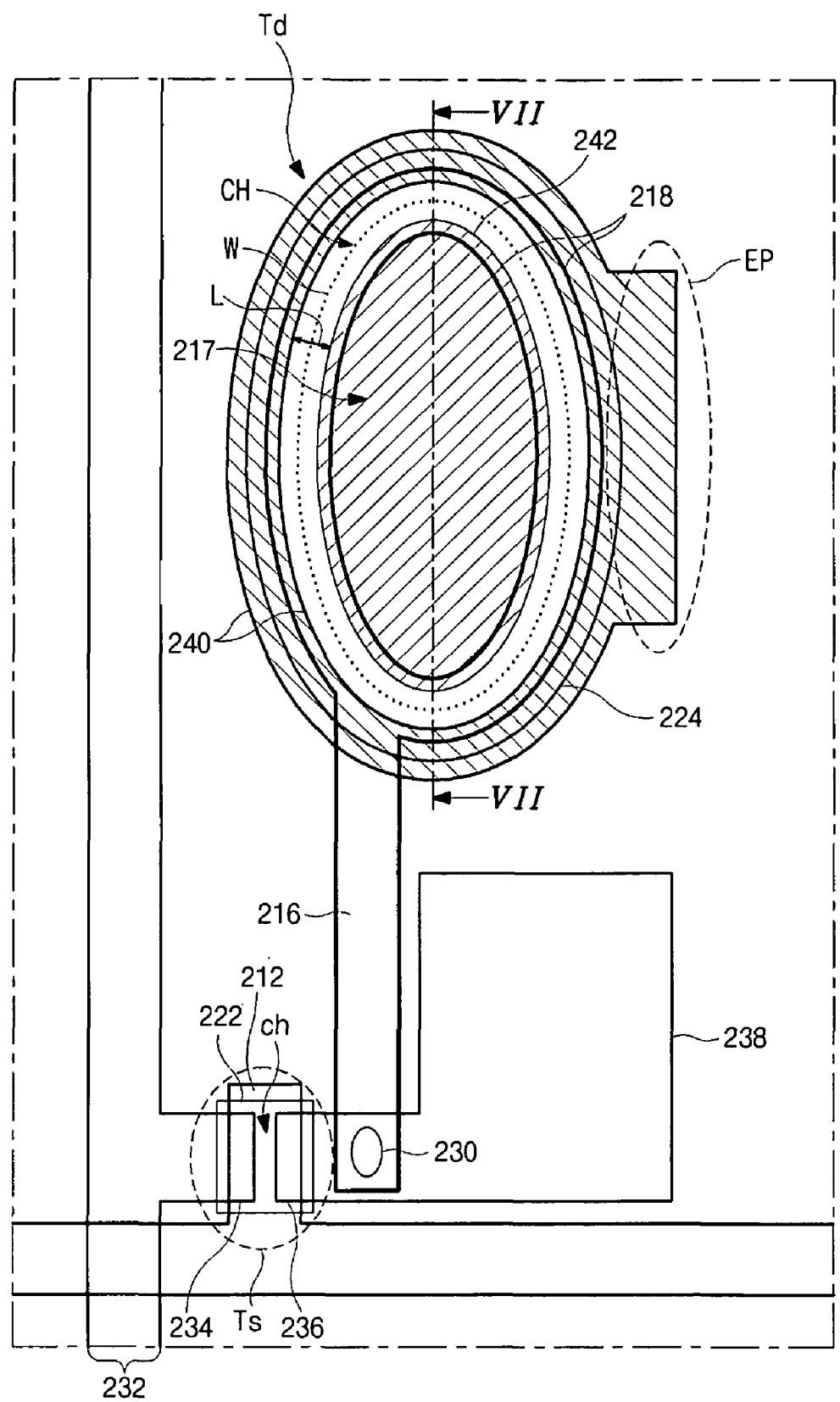
FIG. 6D is a plan view of the formation of switching and driving electrodes in a process of fabricating a substrate for a dual panel type organic electroluminescent device according to another embodiment of the present invention.
Figure 7D:
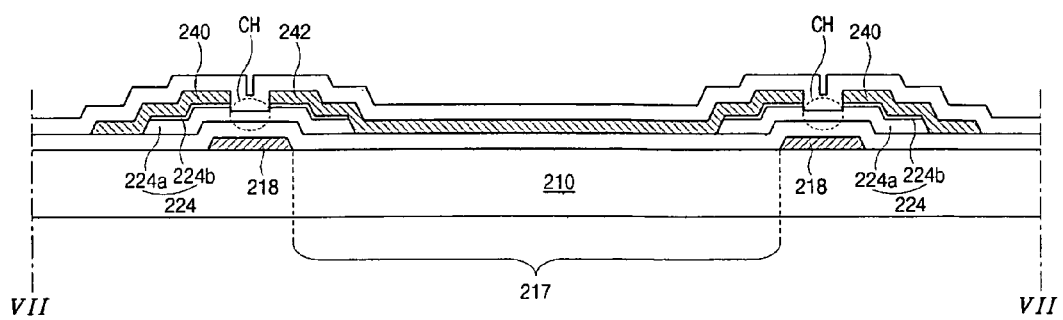
FIG. 7D is a cross-sectional view taken along line "VII-VII" of FIG. 6D.

FIG. 6D is a plan view of the formation of switching and driving electrodes in a process of fabricating a substrate for a dual panel type organic electroluminescent device according to another embodiment of the present invention. FIG. 7D is a cross-sectional view taken along line "VII-VII" of FIG. 6D. Referring to FIGS. 6D and 7D, a data line 232 is formed along the second direction on the substrate 210 including the gate insulating layer 220. The data line 232 includes a switching source electrode 234. The switching source electrode 234 overlaps the switching gate electrode 212. In addition, a switching drain electrode 236, a first capacitor electrode 238, a driving source electrode 240 and a driving drain electrode 242 are simultaneously formed. The switching drain electrode 236 spaced apart from the switching source electrode 234 overlaps the switching gate electrode 212 and is connected to the connection line 216 through the first contact hole 230. The first capacitor electrode 238 extends from the switching drain electrode 236.

The driving source electrode 240 having a ring shape and the driving drain electrode 242 having a circular shape overlap an outer edge portion of the driving gate electrode 218 and an inner edge portion of the driving gate electrode 218, respectively. The driving drain electrode 242 is disposed in the open portion 217. Thus, the driving drain electrode 242 covers a portion of the gate insulation pattern in the open portion 217. Specifically, the driving source electrode 240 has an extended pattern "EP" for establishing an electrical contact with a power electrode in a subsequent process. Although the extended pattern "EP" is shown with a rectangular shape in FIG. 6D, the extended pattern "EP" can have other shapes in other embodiments of the present invention.

As shown in FIG. 7D, the driving semiconductor layer 224 includes a driving active layer 224a including an intrinsic semiconductor material, and a driving ohmic contact layer 224b including an impurity-doped semiconductor material. Although not shown in FIGS. 6D and 7D, the switching semiconductor layer 222 also includes a switching active layer including an intrinsic semiconductor material, and a switching ohmic contact layer including an impurity-doped semiconductor material. The intrinsic semiconductor material is exposed between the switching source electrode 212 and the switching drain electrode 236 by removing the impurity-doped semiconductor material, thereby constituting a switching channel region "ch." Similarly, the intrinsic semiconductor material is exposed between the driving source electrode 240 and the driving drain electrode 242 to constitute a driving channel region "CH."

The switching gate electrode 212, the switching semiconductor layer 222, the switching source electrode 234 and the switching drain electrode 236 form a switching thin film transistor (TFT) "Ts." The driving gate electrode 218, the driving semiconductor layer 224, the driving source electrode 240 and the driving drain electrode 242 form a driving thin film transistor (TFT) "Td." A width "W" of the driving channel region "CH" has a ring shape corresponding to a circumference of a central circle of the driving channel region "CH." A current may flow along a radial direction of the ring shape between the driving source electrode 240 and the driving drain electrode 242. Thus, the width "W" and a W/L ratio of the driving channel region "CH" are sufficiently high in values to carry a high driving current.

Figure 6E:
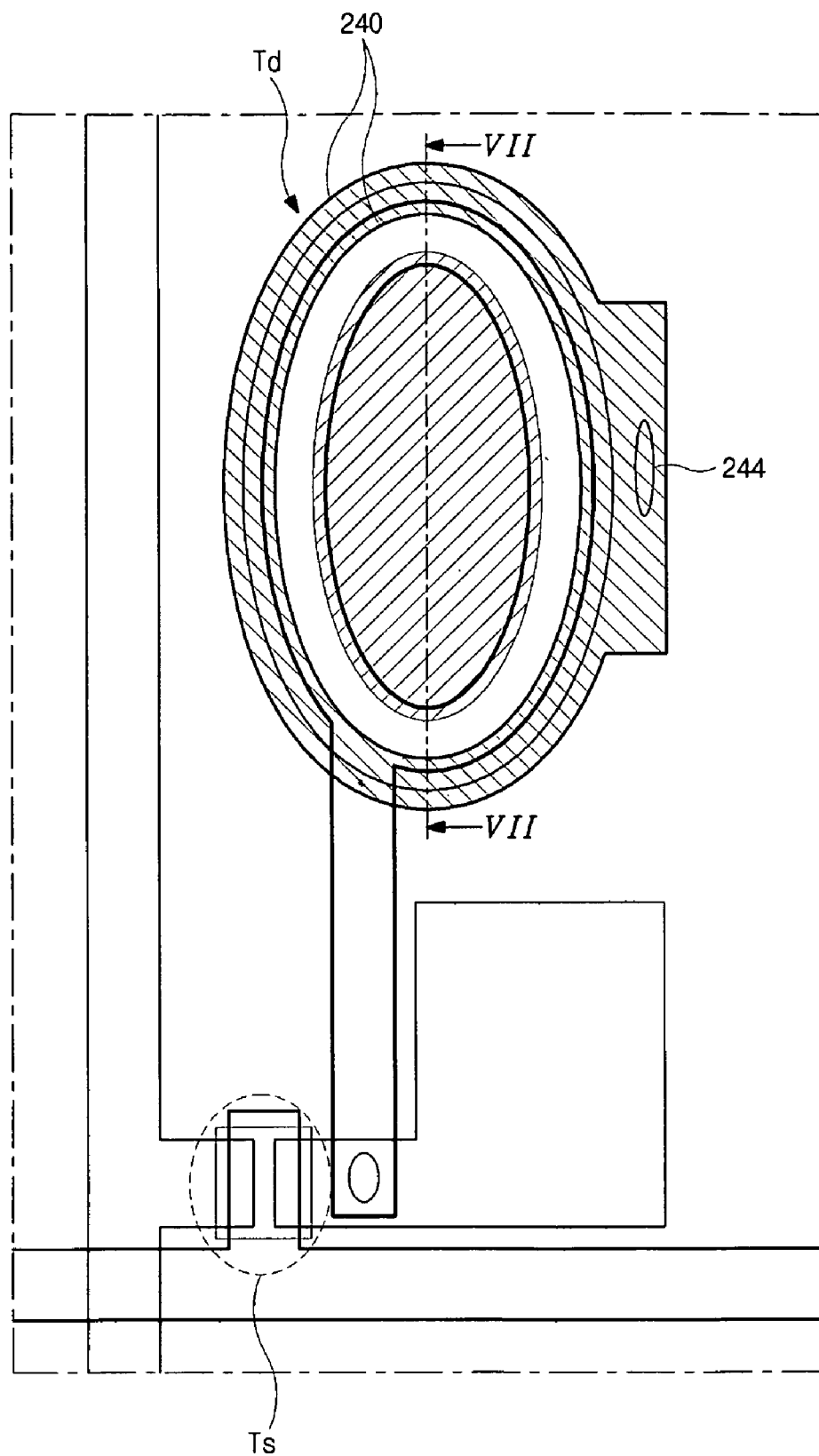
FIG. 6E is a plan view of the formation of a first passivation layer in a process of fabricating a substrate for a dual panel type organic electroluminescent device according to another embodiment of the present invention.
Figure 7E:
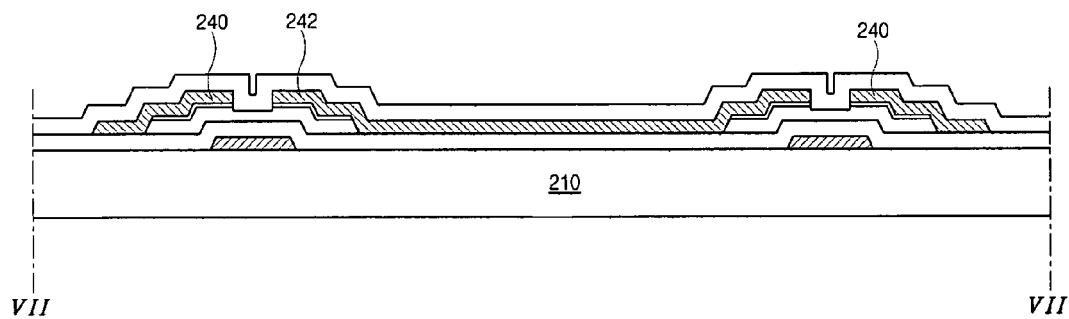
FIG. 7E is a cross-sectional view taken along line "VII-VII" of FIG. 6E.

FIG. 6E is a plan view of the formation of a first passivation layer in a process of fabricating a substrate for a dual panel type organic electroluminescent device according to another embodiment of the present invention. FIG. 7E is a cross-sectional view taken along line "VII-VII" of FIG. 6E. Referring to FIGS. 6E and 7E, a first passivation layer 246 is formed on the switching TFT "Ts" and the driving TFT "Td." The first passivation layer also covers the driving drain electrode in the open portion 217. A second contact hole 244 is provided through the first passivation layer 246. The second contact hole 244 exposes a portion of the driving source electrode 240.

Figure 6F:
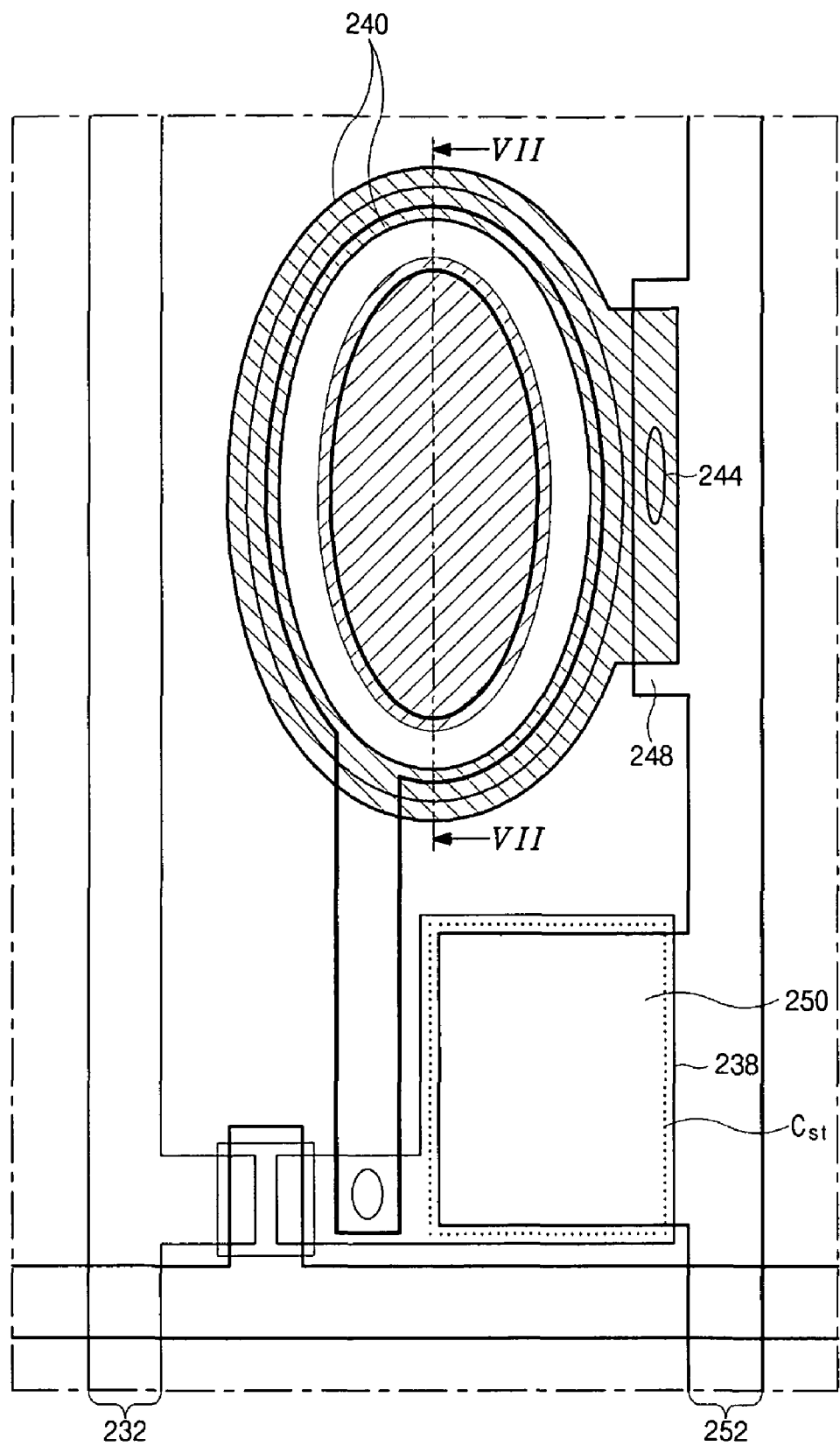
FIG. 6F is a plan view of the formation of a power electrode and a capacitor electrode in a process of fabricating a substrate for a dual panel type organic electroluminescent device according to another embodiment of the present invention.
Figure 7F:
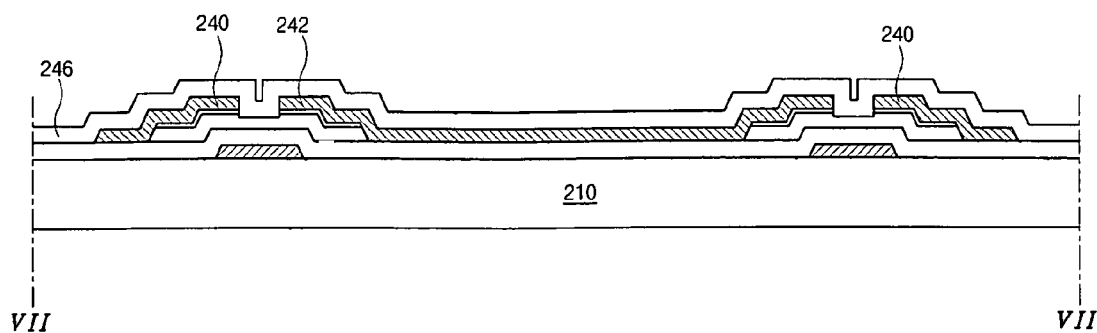
FIG. 7F is a cross-sectional view taken along line "VII-VII" of FIG. 6F.

FIG. 6F is a plan view of the formation of a power electrode and a capacitor electrode in a process of fabricating a substrate for a dual panel type organic electroluminescent device according to another embodiment of the present invention. FIG. 7F is a cross-sectional view taken along line "VII-VII" of FIG. 6F. Referring to FIGS. 6F and 7F, a power line 252 having a power electrode 248 and a second capacitor electrode 250 is formed on the first passivation layer 246 along the second direction. The power electrode 248 is connected to the driving source electrode 240 through the second contact hole 244. The second capacitor electrode 250 overlaps the first capacitor electrode 238. The first and second capacitor electrodes 238 and 250 form a storage capacitor "Cst" with a portion of the first passivation layer 246 interposed therebetween.

Figure 6G:
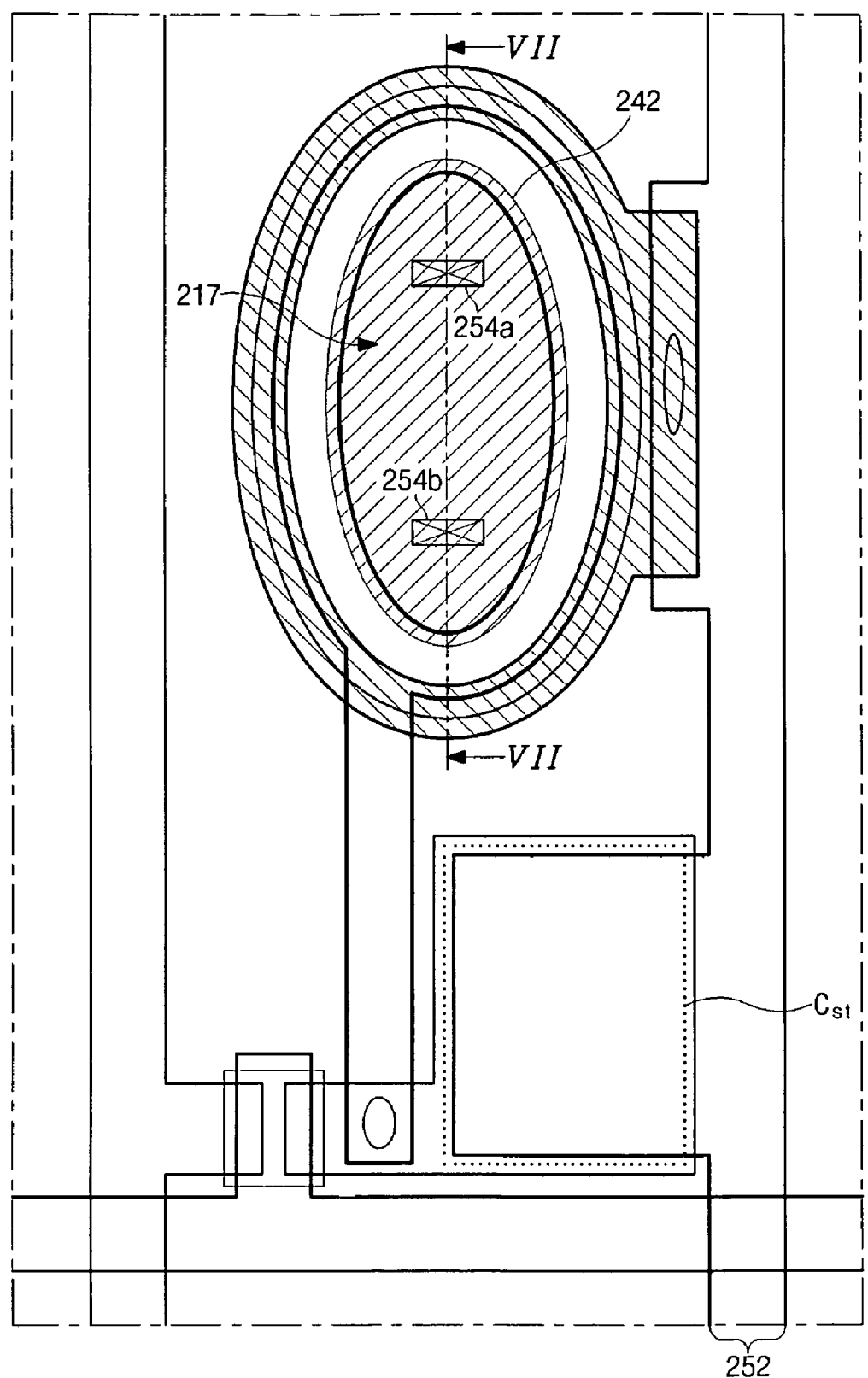
FIG. 6G is a plan view of the formation of a second passivation layer in a process of fabricating a substrate for a dual panel type organic electroluminescent device according to another embodiment of the present invention.
Figure 7G:
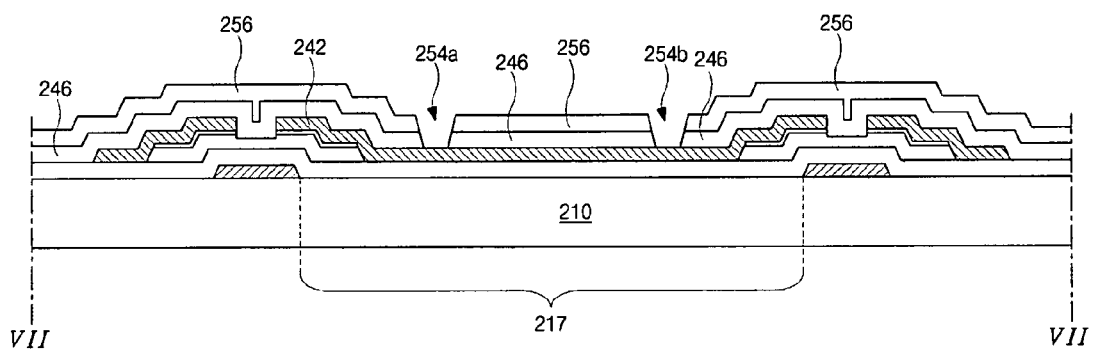
FIG. 7G is a cross-sectional view taken along line "VII-VII" of FIG. 6G.

FIG. 6G is a plan view of the formation of a second passivation layer in a process of fabricating a substrate for a dual panel type organic electroluminescent device according to another embodiment of the present invention. FIG. 7G is a cross-sectional view taken along line "VII-VII" of FIG. 6G. Referring to FIGS. 6G and 7G, a second passivation layer 256 is formed on the substrate including the power line 252 and the first passivation layer 242. A third contact hole 254a and a fourth contact hole 254b are provided through the second passivation layer 256. The third contact hole 254a and the fourth contact hole 254b expose a portion of the driving drain electrode 242 through the first passivation layer 246. The third and fourth contact holes 254a and 254b are disposed in the open portion 217.

Figure 6H:
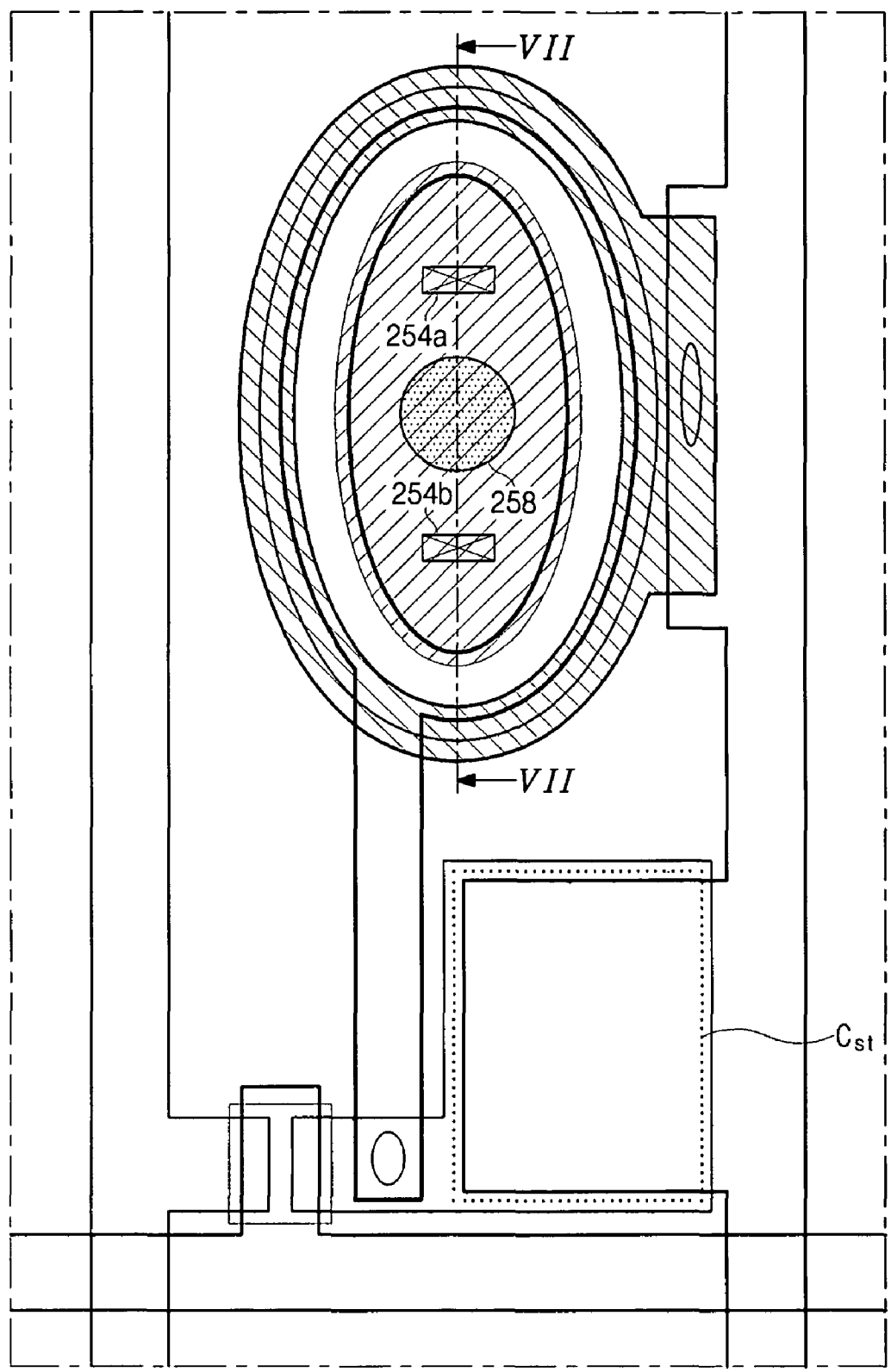
FIG. 6H is a plan view of the formation of a protrusion pattern in a process of fabricating a substrate for a dual panel type organic electroluminescent device according to another embodiment electroluminescent device according to another embodiment of the present invention.
Figure 7H:
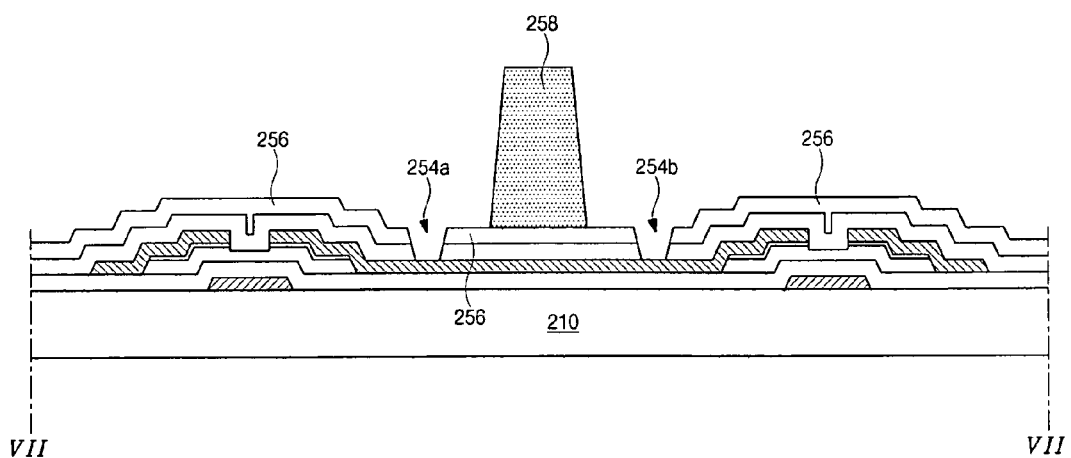
FIG. 7H is a cross-sectional view taken along line "VII-VII" of FIG. 6H.

FIG. 6H is a plan view of the formation of a protrusive pattern in a process of fabricating a substrate for a dual panel type organic electroluminescent device according to another embodiment of the present invention. FIG. 7H is a cross-sectional view taken along line "VII-VII" of FIG. 6H. Referring to FIGS. 6H and 7H, a protrusive pattern 258 is formed on the second passivation layer 256 between the third contact hole 254a and the fourth contact hole 254b.

Figure 6I:
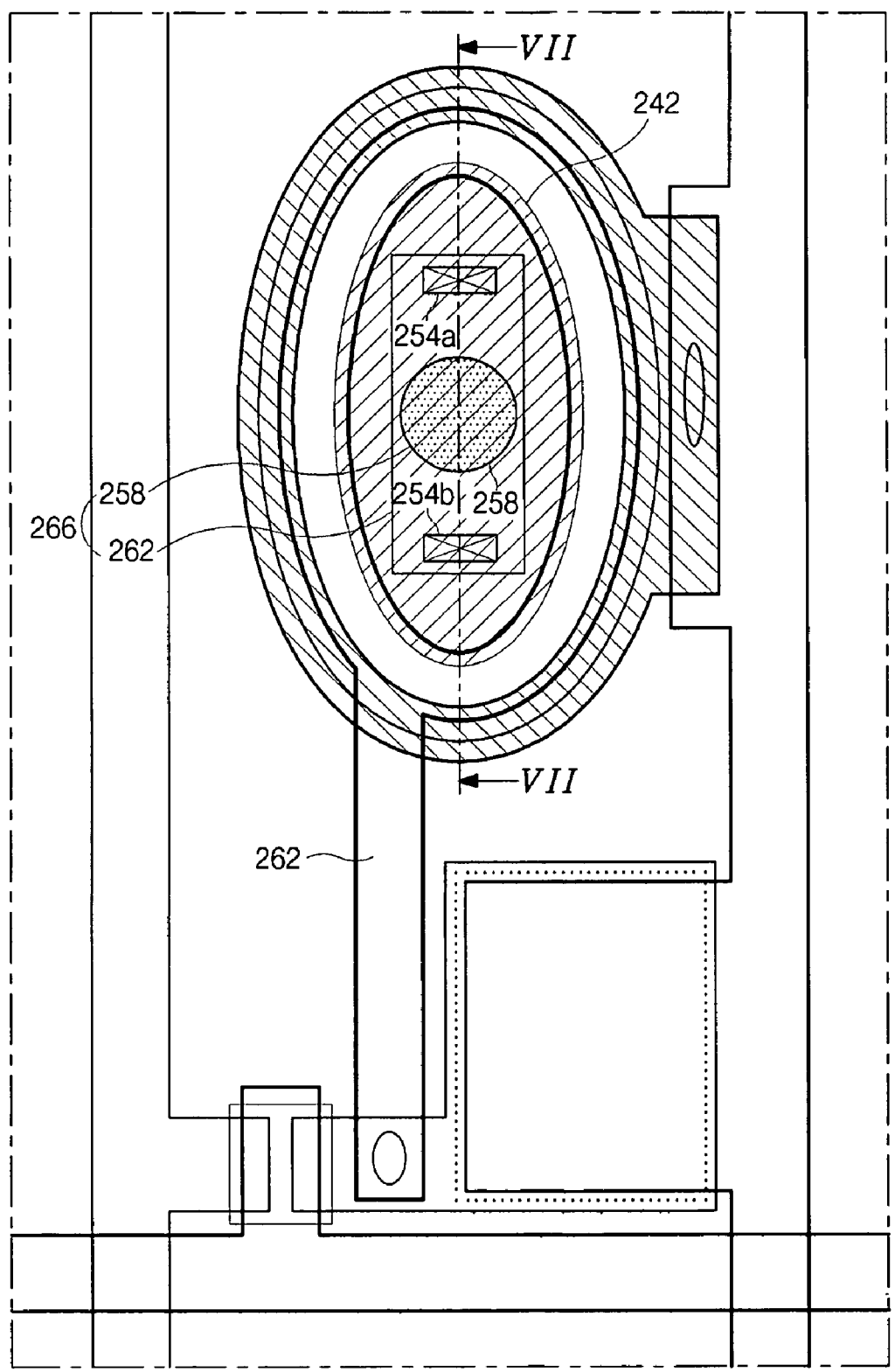
FIG. 6I is a plan view of the formation of an electric connection pattern in a process of fabricating a substrate for a dual panel type organic electroluminescent device according to another embodiment of the present invention.
Figure 7I:
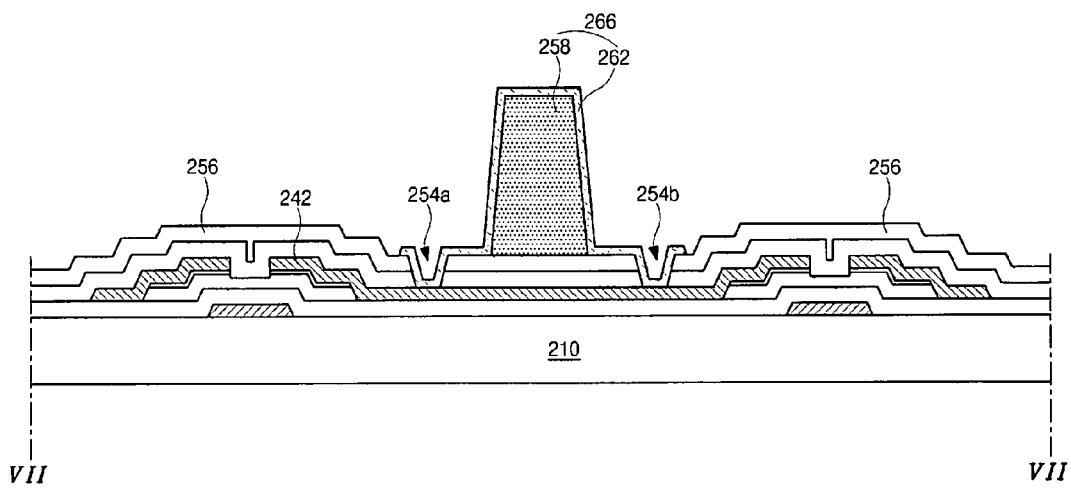
FIG. 7I is a cross-sectional view taken along line "VII-VII" of FIG. 6I.

FIG. 6I is a plan view of the formation of an electric connection pattern in a process of fabricating a substrate for a dual panel type organic electroluminescent device according to another embodiment of the present invention. FIG. 7I is a cross-sectional view taken along line "VII-VII" of FIG. 6I. Referring to FIGS. 6I and 7I, a connection electrode 262 is formed on the protrusive pattern 258. The connection electrode 262 is connected to the driving drain electrode 242 through the third and fourth contact holes 254a and 254b. The connection electrode 262 may completely wrap the protrusive pattern 258 to constitute an electric connection pattern with the protrusive pattern 258.

Figure 8:
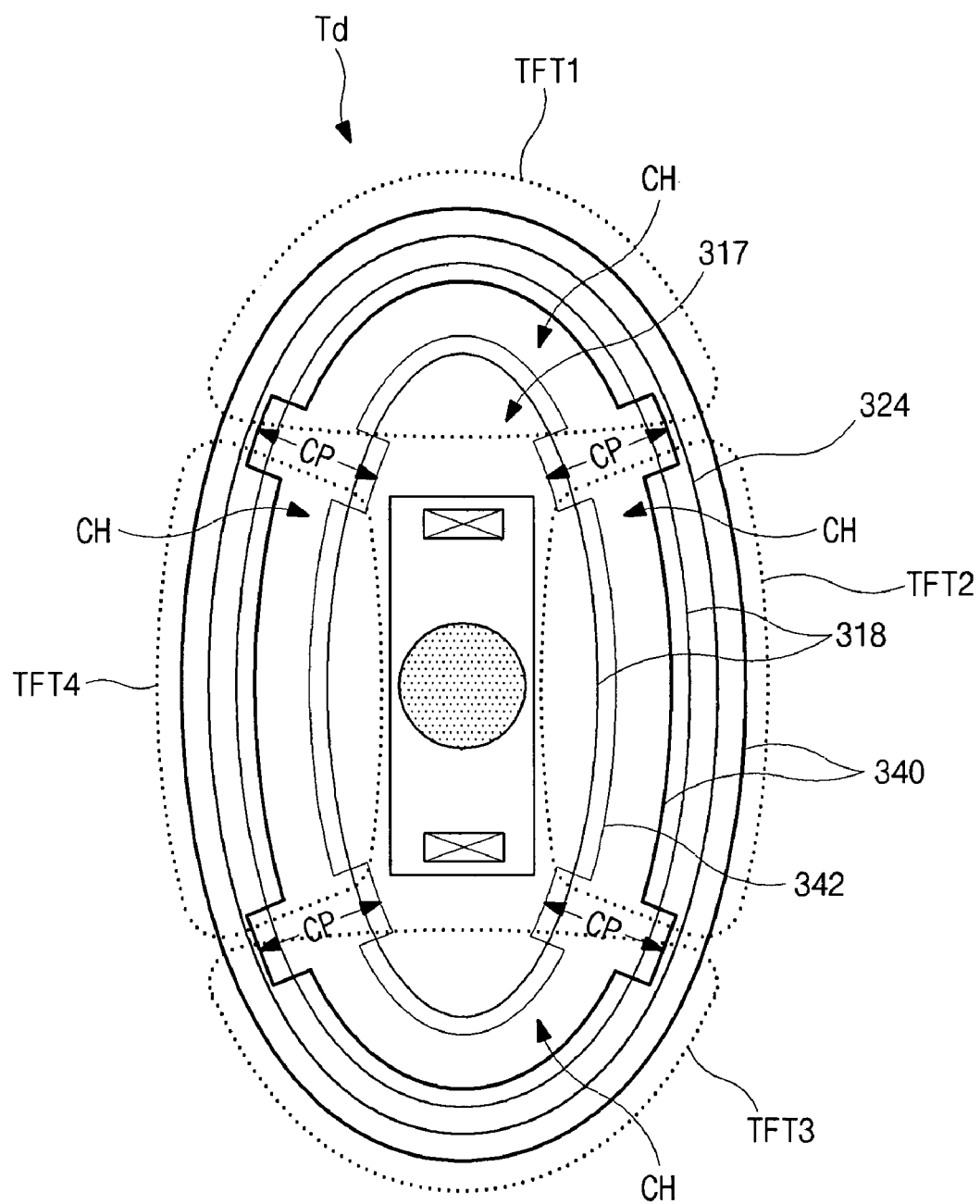
FIG. 8 is a plan view of an exemplary driving thin film transistor for a dual panel type organic electroluminescent device according to another embodiment of the present invention.

FIG. 8 is a plan view of an exemplary driving thin film transistor for a dual panel type organic electroluminescent device according to another embodiment of the present invention. Referring to FIG. 8, a ring-shaped gate electrode 318 is formed on a substrate. Accordingly, the gate electrode 318 has a circular open portion 317. A semiconductor layer 324 is formed over the gate electrode 318. In addition, a ring-shaped source electrode 340 and a circular-shaped drain electrode 342 are formed on the semiconductor layer 324.

The source electrode 340 overlaps an outer edge of the gate electrode 318. The drain electrode 342 disposed in the open portion 317 overlaps an inner edge of the gate electrode 318. The semiconductor layer 324 exposed between the source and drain electrodes 340 and 342 forms a channel region "CH." The source electrode 340 and the drain electrode 342 may have concave portions "CP" exposing end portions of the semiconductor layer 324. In the concave portions "CP," since the source and drain electrodes 340 and 342 do not overlap the semiconductor layer 324, a channel for current path is not generated in the semiconductor layer 324. Accordingly, the channel region "CH" may be divided into four sub-regions by the concave portions "CP."

For example, the source electrode 340 and the drain electrode 342 may have four concave portions "CP." A driving thin film transistor (TFT) may include first to fourth TFTs "TFT1" to "TFT4" connected to one another in parallel with respect to the gate electrode 318. Since a sum of currents passing through the first to fourth TFTs "TFT1" to "TFT4" corresponds to a driving current for an organic electroluminescent diode (not shown), the driving current increases in comparison to the related art arrangement. In addition, since the first to fourth TFTs "TFT1" to "TFT4" are connected to one another in parallel with respect to the gate electrode 318, a total electric stress is uniformly dissipated into the first to fourth TFTs "TFT1" to "TFT4" and a stability of the driving TFT is improved. Although the driving TFT is shown to include four TFTs in parallel, the number of TFTs included in the driving TFT may vary in other embodiments of the present invention.

Figure 9:
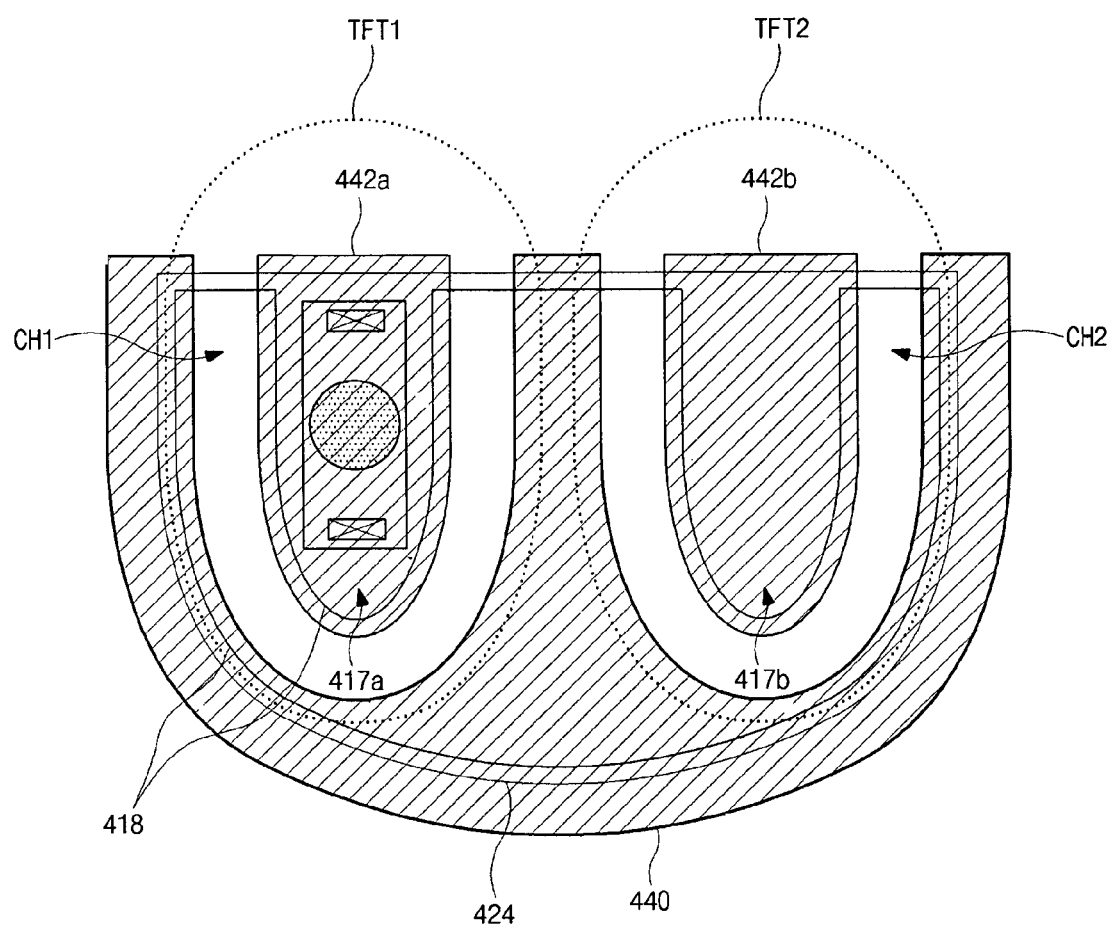
FIG. 9 is a plan view of an exemplary driving thin film transistor for a dual panel type organic electroluminescent device according to another embodiment of the present invention.

FIG. 9 is a plan view of an exemplary driving thin film transistor for a dual panel type organic electroluminescent device according to another embodiment of the present invention. Referring to FIG. 9, a gate electrode 418 having a curved "W" shape is formed on a substrate. The gate electrode 418 includes a first concave portion 417a and a second concave portion 417b. Each of the first concave portion 417a and the second concave portion 417b is shaped as a half circle. A semiconductor layer 424 is formed over the gate electrode 418.

A source electrode 440 having a curved "W" shape and first and second drain electrodes 442a and 442b are formed on the semiconductor layer 424. Each of the first and second drain electrodes 442a and 442b is shaped as a half circle. The first and second drain electrodes 442a and 442b overlap inner edge portions of the gate electrode 418 in the first and second concave portions 417a and 417b, respectively. The source electrode 440 overlaps an outer edge portion of the gate electrode 418 opposite to the inner edge portion. The semiconductor layer 424 exposed between the first drain electrode 442a and the source electrode 440 constitutes a first channel region "CH1" having a "U" shape or a half ring shape. The semiconductor layer 424 exposed between the second drain electrode 442b and the source electrode 440 constitutes a second channel region "CH2" having a "U" shape or a half ring shape. Accordingly, the gate electrode 418, the semiconductor layer 424, the source electrode 440 and the first drain electrode 442a form a first thin film transistor (TFT) "T1" including the first channel region "CH1." The gate electrode 418, the semiconductor layer 424, the source electrode 440 and the second drain electrode 442b form a second thin film transistor (TFT) "T2" including the second channel region "CH2." As a result, a driving TFT "Td" for an organic electroluminescent diode (not shown) may include the first and second TFTs "T1" and "T2" connected to each other in parallel with respect to the gate electrode 418.

A protrusive pattern 458 may be formed over the first drain electrode 442a and a connection electrode 462 may be formed over the protrusive pattern 458. The connection electrode 462 may completely wrap the protrusive pattern 458 and may be connected to the first drain electrode 442a through first and second contact holes 454a and 454b. Accordingly, the protrusive pattern 458 and the connection electrode 462 form an electric connection pattern 466. Although the electric connection pattern 466 is formed over the first drain electrode 442a in FIG. 9, the electric connection pattern 466 may be disposed over the second drain electrode 442b or may be disposed both over the first and second drain electrodes 442a and 442 in other embodiments of the present invention. In addition, the gate electrode may include more than two concave portions in other embodiments of the present invention.

Although not shown in FIG. 9, a width of the channel region of the driving TFT corresponds to a sum of circumferences of two central half circles between the source electrode 440 and the drain electrodes 442a and 442b. Also not shown, a length of the channel region of the driving TFT corresponds to a distance between the source electrode 440 and the drain electrodes 442a and 442b. Accordingly, a current may flow in a radial direction of the two central half circles between the source electrode 440 and the drain electrodes 442a and 442b. As a result, the width and a W/L ratio of the driving TFT have are sufficiently high in values for carrying a high driving current.

According to embodiments of the present invention, a dual panel type organic electroluminescent device has some advantages. First, since array patterns and an organic EL diode are formed on the respective substrate, production yield and production management efficiency are improved. The lifetime of an organic EL device is also lengthened. Second, since the ELD is a top emission type, a thin film transistor can be easily designed, and a high resolution and a high aperture ratio can be obtained regardless of lower array patterns. Third, since an electric connection pattern is formed in a thin film transistor region, deterioration of the electric connection pattern due to a separator is prevented and production yield is improved. In addition, the performance of the driving thin film transistor is improved because of the ring-shaped thin film transistor.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   first and second substrates facing each other and spaced apart from each other;
   a gate line on an inner surface of the first substrate;
   a data line and a power line crossing the gate line and spaced apart from each other;
   a switching thin film transistor connected to the gate line and the data line;
   a driving thin film transistor connected to the switching thin film transistor and the power line, the driving thin film transistor having a channel region including at least two-half ring shapes, wherein the at least two-half ring shapes each having a "U" shape are disposed adjacent to each other to constitute a "W" shape;
   an electric connection pattern connected to the driving thin film transistor, the connection pattern being disposed over the driving thin film transistor; and
   an organic electroluminescent diode on an inner surface of the second substrate, the organic electroluminescent diode being connected to the electric connection pattern.

2. The organic electroluminescent device according to claim 1, wherein the channel region has a channel width corresponding to a sum of circumferences of central half circles of the at least two-half ring shapes and a length corresponding to a channel width of the at least two-half ring shapes.

3. The organic electroluminescent device according to claim 1, wherein a current flows along a radial direction of the at least two-half ring shapes in the channel region.

4. The organic electroluminescent device according to claim 1, wherein the driving thin film transistor comprises:
   a driving gate electrode of at least two-half ring shapes having at least two concave portions;
   a driving semiconductor layer over the driving gate electrode; and
   a driving source electrode, at least two driving drain electrodes on the driving semiconductor layer, the driving source electrode having at least two-half ring shapes and overlapping an outer edge portion of the driving gate electrode, each of the at least two driving drain electrodes having a half circular shape in the at least two concave portions and overlapping an inner edge portion of the driving gate electrode.

5. The organic electroluminescent device according to claim 1, wherein the switching thin film transistor includes a switching gate electrode, a switching semiconductor layer over the switching gate electrode, a switching source electrode on the switching semiconductor layer and a switching drain electrode on the switching semiconductor layer, and the driving thin film transistor includes a driving gate electrode, a driving semiconductor layer over the driving gate electrode, a driving source electrode on the driving semiconductor layer and a driving drain electrode on the driving semiconductor layer.

6. The organic electroluminescent device according to claim 5, wherein the switching semiconductor layer and the driving semiconductor layer includes one of an amorphous silicon and a microcrystalline silicon.

7. The organic electroluminescent device according to claim 5, wherein the electric connection pattern contacts the driving drain electrode and the organic electroluminescent diode.

8. The organic electroluminescent device according to claim 1, wherein the electric connection pattern includes a protrusive pattern extending from the first substrate to the second substrate and a connection electrode wrapping the protrusive pattern.

9. The organic electroluminescent device according to claim 1, wherein the channel region includes at least two-elliptical half ring shapes.

10. The organic electroluminescent device according to claim 1, wherein the electric connection pattern is disposed over one of at least two central portions of the at least two-half ring shapes.

* * * * *